(12) United States Patent
Seko

(10) Patent No.: US 7,977,805 B2
(45) Date of Patent: Jul. 12, 2011

(54) FLEXIBLE WIRING SUBSTRATE, SEMICONDUCTOR DEVICE AND ELECTRONIC DEVICE USING FLEXIBLE WIRING SUBSTRATE, AND FABRICATING METHOD OF FLEXIBLE WIRING SUBSTRATE

(75) Inventor: Toshiharu Seko, Yamatokoriyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 1067 days.

(21) Appl. No.: 11/270,651

(22) Filed: Nov. 10, 2005

(65) Prior Publication Data

US 2006/0097368 A1   May 11, 2006

(30) Foreign Application Priority Data

Nov. 11, 2004 (JP) .................................. 2004-328173
Oct. 13, 2005 (JP) .................................. 2005-299402

(51) Int. Cl.
*H01L 23/52* (2006.01)
*H01L 23/48* (2006.01)
*H01L 29/40* (2006.01)

(52) U.S. Cl. ................ 257/786; 257/E21.511; 257/668; 257/780; 257/781; 438/612; 438/666

(58) Field of Classification Search .................. 257/668, 257/704, 632, 678, 778–781, 786, E21.503, 257/E21.511, E23.065; 250/208.1; 156/273.9; 438/612, 617, 666

See application file for complete search history.

(56) References Cited

U.S. PATENT DOCUMENTS

| 5,138,145 | A  | * | 8/1992 | Nakamura et al. | 250/208.1 |
| 5,212,402 | A  | * | 5/1993 | Higgins, III | 257/532 |
| 5,859,471 | A  | * | 1/1999 | Kuraishi et al. | 257/666 |
| 6,077,766 | A  | * | 6/2000 | Sebesta et al. | 438/618 |
| 6,249,046 | B1 | * | 6/2001 | Hashimoto | 257/691 |
| 6,291,779 | B1 | * | 9/2001 | Lubert et al. | 174/265 |
| 6,340,798 | B1 | * | 1/2002 | Tokuda | 174/261 |
| 6,518,649 | B1 | * | 2/2003 | Iwane et al. | 257/668 |

FOREIGN PATENT DOCUMENTS

| JP | 02-122532 | | 5/1990 |
| JP | 04-294556 | | 10/1992 |
| JP | 05-029397 | A | 2/1993 |
| JP | 05-047836 | | 2/1993 |
| JP | 05-183018 | A | 7/1993 |
| JP | 10-32227 | A | 2/1998 |
| JP | 10-125850 | | 5/1998 |
| JP | 11-251363 | A | 9/1999 |
| JP | 2003-115511 | | 4/2003 |
| JP | 2003-303862 | A | 10/2003 |
| JP | 2005-229008 | | 8/2005 |

* cited by examiner

*Primary Examiner* — Chris Chu
(74) *Attorney, Agent, or Firm* — Harness, Dickey & Pierce, P.L.C.

(57) ABSTRACT

A flexible wiring substrate is provided which realizes a fine pitch of a wiring pattern and improves mechanical strength of the wiring pattern so as to prevent breaks or exfoliation of the wiring pattern. A flexible wiring substrate 3 of the present invention includes an insulation tape 6, and a wiring pattern 7 formed on the insulation tape 6. A thickness of the wiring pattern 7 is made thinner in a mounting region, where a semiconductor element is connected to, than in a non-mounting region.

6 Claims, 15 Drawing Sheets

FLEXIBLE WIRING SUBSTRATE, SEMICONDUCTOR DEVICE AND ELECTRONIC DEVICE USING FLEXIBLE WIRING SUBSTRATE, AND FABRICATING METHOD OF FLEXIBLE WIRING SUBSTRATE

This Nonprovisional application claims priority under 35 U.S.C. §119(a) on Patent Application No. 328173/2004 filed in Japan on Nov. 11, 2004, and on Patent Application No. 299402/2005 filed in Japan on Oct. 13, 2005, the entire contents of which are hereby incorporated by reference.

FIELD OF THE INVENTION

The present invention relates to a flexible wiring substrate, a semiconductor device and an electronic device which use the flexible wiring substrate, and a fabricating method of the flexible wiring substrate. The present invention particularly relates to (i) a flexible wiring substrate on which a semiconductor element is mounted, (ii) a semiconductor device and an electronic device which use the semiconductor element, and (iii) a fabricating method of the flexible wiring substrate.

BACKGROUND OF THE INVENTION

A TCP (tape carrier package), a COF (chip on film), and the like are examples of a semiconductor device having a structure in which a semiconductor element is connected to and mounted on a flexible substrate. The TCP and the COF have the following distinctions, for example.

First, the TCP has an opening section which is provided in advance to cause the semiconductor element to be mounted on an insulation tape. A wiring pattern is formed so that wires of the pattern reach out so that leading ends of the wires are bonded to the semiconductor element. On the other hand, the COF differs from the TCP in that the COF has no opening section for mounting the semiconductor element, and the semiconductor element is connected to and mounted on a wiring pattern formed on a surface of a thin film insulation tape.

In the TCP, a thickness of the wiring pattern is 18 µm or greater because the wires of the wiring pattern reach out from the TCP. As such, it is difficult to form a wiring pattern having a pitch of below 45 µm. On the other hand, the COF allows the wiring pattern to have a thickness of 8 µm or less because the wiring pattern is formed on the surface of the thin film insulation tape. Thus, the wiring pattern is easily formed so as to have a wiring pitch of 35 µm or less in the COF. In this regard, the COF differs from the TCP.

Further, the TCP has a slit in a portion to be folded after the TCP is mounted onto a liquid crystal panel or the like. In this regard, unlike the TCP, the COF has no slit via which the folding is carried out, so that the COF can be flexibly folded over any portion of the thin film insulation tape.

The TCP is formed by stacking copper foil on the insulation tape made of polyimide using bonding adhesive. On the other hand, the COF is different from the TCP in that the COF is formed using either of a casting method or a spattering method (metallizing method). In the casting method, a backside of the copper foil is coated with polyimide or the like and then hardened. In the spattering method, copper is spattered and stacked on a thin film insulating layer, which is made of polyimide or the like.

For its intended use, the COF employs a thin film insulation tape which can be freely folded. Further, wires of the wiring pattern disposed on a surface of the thin film insulation tape are electrically connected to corresponding terminals of the semiconductor element, respectively, while a connector section for external connection is connected to a liquid crystal panel, a printed board, or the like. A solder resist is applied to other exposed portions of the wiring pattern. This allows the wiring pattern to be securely insulated.

As described above, the COF is a technique which facilitates fine pitch design of the wiring pattern. However, the COF actually employs a wiring pattern having a thickness of 8 µm to 18 µm according to a wiring pitch of the wiring pattern, i.e., 35 µm to 50 µm or greater. In this regard, no patent document describes such a technique related to the thickness of the wiring pattern. On the other hand, as to the TCP, a technique related to the thickness of the wiring pattern is described in patent reference 1, for example.

With reference to FIGS. 11 and 12, a conventional COF is described. FIG. 11 is a cross-sectional view illustrating a schematic structure of a conventional COF 101. FIG. 12 is a cross-sectional view illustrating a schematic structure of the COF 101 taken along line C-C' of FIG. 11. As illustrated in FIGS. 11 and 12, the COF 101 has a structure in which a semiconductor element 102 is connected to and mounted on a tape carrier 103.

In the tape carrier 103 of the COF 101 illustrated in FIGS. 11 and 12, a wiring pattern 105 is formed on an insulation tape 104. The wiring pattern 105 is realized by forming copper foil or spattered copper having a thickness of 8 µm to 18 µm, using the casting method or the spattering method (metallizing method). As illustrated in FIGS. 11 and 12, the wiring pattern 105 is formed so as to have a uniform thickness in all regions including a region where the semiconductor element 102 is connected to and mounted on and other regions.

[Patent Reference 1]
Japanese Unexamined Patent Publication, No. 32227/1998 (Tokukaihei 1998-32227, publication date: Feb. 3, 1998)

According to the Patent Reference 1, a thickness of a wiring pattern is made thicker (26 µm) in an opening section for mounting a semiconductor element and in a slit section via which the folding is carried out. This allows an improvement in mechanical strength of wiring pattern. On the other hand, the thickness of the wiring pattern is made thinner (18 µm) in an OLB (outer lead bonding) section, to which a liquid crystal panel or a substrate is connected. This allows top portions of the wiring pattern to be broad in width to secure a bonding area.

However, the wiring pattern in the opening section, where the semiconductor element is mounted, has actually the finest pitch. As such, it is necessary to make thinner the thickness of the wiring pattern. Even if the wiring pattern is formed so as to have a uniform thickness of 18 µm in all regions, mechanical strength will not be affected. Actually, mass-produced TCP semiconductor devices employ wiring patterns having a thickness of 18 µm. That is, a technique disclosed in patent reference 1 is neither realistic nor necessary. As described here, it is difficult to realize in the actual TCP such a fine pitch of the wiring pattern.

Compared to the TCP, the COF facilitates the realization of such a fine pitch of the wiring pattern (inner lead). With regard to wiring patterns (inner lead) in mass-produced semiconductor devices, the TCP has a limit wiring pitch of 45 µm, whereas the COF realizes a wiring pitch of 35 µm. Further, it is believed that a wiring pitch of 30 µm or less is also possible.

Notwithstanding, according to the reviews and considerations of an inventor of the present application, the inventor encountered the following problems when realizing the fine pitch in the COF.

For example, one of the above problems is that, when realizing a fine pitch of a wiring pattern (inner lead), it becomes difficult to carry out a pattern etching with respect to the wiring pattern (inner lead) so that the wiring pattern has a good shape while the wiring pattern has a conventional thickness of 8 µm. This is especially the case when the wiring pitch becomes 30 µm or less.

That is, as the wiring pattern (inner lead) has a finer pitch, a width of the wiring pattern (inner lead) also needs to be smaller. This makes it difficult that the wiring pattern is etched so as to have a good trapezoid cross section. This causes the cross section of the wiring pattern to become close to a triangle shape, and causes the thickness of the wiring pattern (inner lead) to have a greater variation.

In this regard, the following describes in more detail with reference to FIG. 13.

FIG. 13 illustrates a structure obtained by making finer the pitch of the wiring pattern 105 in the conventional COF 101 illustrated in FIGS. 11 and 12. For example, a wiring pitch of greater than 35 µm does not affect etching applied to the wiring pattern 105. However, with a wiring pitch of less than 35 µm, it becomes difficult to carry out an etching process to have a trapezoid cross section which indicates a good cross sectional shape of the wiring pattern 105. Under such a condition, cross section of the wiring pattern 105 becomes closer to a triangle shape as illustrated in FIG. 13. Further, after the etching process, the thickness of the wiring pattern 105 has a greater variation, which appears to degrade bonding between the semiconductor element 102 and the wiring pattern 105.

As a solution for the above problems, it may be contrived to reduce the thickness of the copper foil or spattered copper (wiring pattern). By reducing the thickness of the copper foil or spattered copper (wiring pattern), it becomes possible to carry out the pattern etching so that the wiring pattern has a good shape. For example, even when the wiring pattern (inner lead) has a wiring pitch of 30 µm, it is possible to carry out the pattern etching with respect to the wiring pattern to have a trapezoid cross section which indicates a good cross sectional shape of the wiring pattern, by reducing the thickness of the copper foil or spattered copper (wiring pattern) to be approximately 5 µm.

However, the reduction in thickness of the wiring pattern (inner lead), caused by realization of fine pitch of the wiring pattern, gives rise to the problem of degrading the mechanical strength of the wiring pattern. This may cause the wiring pattern to be broken or exfoliated during a period from a step for connecting and mounting a semiconductor element to a step for mounting a module of a COF semiconductor device.

In this regard, the following describes in more detail, with reference to FIGS. 14 and 15. FIG. 14 illustrates a structure obtained by making thinner the thickness of the copper foil or spattered copper forming the wiring pattern 105 in the conventional COF 101 illustrated in FIGS. 11 and 12. FIG. 15 is a cross-sectional view illustrating a schematic structure of the COF 101 taken along line D-D' of FIG. 14. As illustrated in FIGS. 14 and 15, it is possible to carry out a etching process to the wiring pattern to have a good cross sectional shape, by reducing the thickness of the copper foil or spattered copper. However, due to the degrading of its mechanical strength, the wiring pattern may tend to be broken or exfoliated during a period from the step for connecting and mounting a semiconductor element to the step for mounting a module of a COF semiconductor device.

Currently, there has been a demand on multi-pin support for the COF. Further, reduction in size and thickness of the COF have been also demanded. These demands will be met by realizing (i) fine pitch of the connecting sections for connecting the semiconductor element and the external connection connector section where the wiring pattern is connected, and (ii) reduction in thickness of the wiring pattern or the like. For this purpose, the width and thickness of the wiring pattern (inner lead) also needs to be reduced. However, the conventional techniques do not easily enable realization of fine pitch design as described above, because the COF needs to be flexibly folded while requiring improved mechanical strength which allows reduction in thickness of the wiring pattern.

SUMMARY OF THE INVENTION

The present invention was made to solve the foregoing problems. An object of the present invention is to provide (i) a flexible wiring substrate having a structure: in which a wiring pattern is designed with a fine pitch and formed by etching so as to have a good shape; in which a variation in thickness of the wiring pattern (inner lead) is reduced; and in which mechanical strength of the wiring pattern is improved so as to prevent brakes or exfoliation of the wiring pattern, (ii) a semiconductor device and an electronic device which use the flexible wiring substrate, and (iii) a fabricating method of the flexible wiring substrate.

To solve the foregoing problems, a flexible wiring substrate of the present invention includes an insulating layer; and a wiring layer formed on the insulating layer, the wiring layer being formed so as to have a predetermined pattern and having a mounting region for connecting and mounting an electronic component, and a thickness of the wiring layer being less in the mounting region than in a non-mounting region.

According to the above arrangement, the wiring pattern is formed so as to have a predetermined pattern, and has plural wires according to the pattern. The predetermined pattern is formed with the plural wires, and is arbitrary designed according to intended use. Further, the wiring layer has the mounting region where the electronic component is connected to and mounted on. The mounting region is a region, where the electronic component is mounted, on the wiring layer. The mounting region specifically refers to a region covered by the electronic component. Since the thickness of the wiring layer is less in the mounting region than in the non-mounting region, a connecting section is easily fabricated. The non-mounting region is a region other than the mounting region on the wiring layer.

Thus, for example, when the wires are etched, the wires can be etched so as to have a good shape. Further, a variation in thickness of the wires can be reduced. This realizes a fine pitch of the wiring pattern.

Further, mechanical strength of the wiring layer can be improved because the thickness of the wiring layer is greater in the non-mounting region than in the mounting region. Thus, even when the flexible wiring substrate is folded, the wiring pattern can be prevented from being broken or exfoliated.

To solve the foregoing problems, a flexible wiring substrate of the present invention includes an insulating layer; and a wiring layer formed on the insulating layer, the wiring layer being formed so as to have a predetermined pattern and having a connecting section for connecting and mounting an electronic component, a thickness of the wiring layer being less in the connecting section than in a non-connecting section (a portion other than connecting section).

To solve the foregoing problems, a flexible wiring substrate of the present invention includes an insulating layer; and a wiring layer formed on the insulating layer, the wiring layer being formed so as to have a predetermined pattern and having, within a mounting region where an electronic component is connected and mounted, a connecting section for performing connection with the electronic component, a thickness of the wiring layer being less exclusively in the connecting section than in a non-connecting section.

According to the above arrangement, the wiring pattern is formed so as to have a predetermined pattern, and has plural wires according to the pattern. The predetermined pattern is formed with the plural wires, and is arbitrary designed according to intended use. Further, the wires of the wiring layer have the connecting section for performing the connection with the electronic component. The connecting section is provided within the mounting region where the electronic component is connected and mounted. That is, the wiring layer has the mounting region for mounting the electronic component, and the mounting region contains the connecting section for performing the connection with the electronic component. Further, the thickness of the wiring layer is less in the connecting section than in the non-connecting section. This structure facilitates fabrication of the connecting section. Note that, the non-connecting section is a region other than the connecting section on the wiring layer.

Thus, when etching is applied for example, the wires can be etched so as to have a good shape. Further, a variation in thickness of the wires can be reduced. This realizes a fine pitch of the wiring pattern.

Further, mechanical strength of the wiring layer can be improved because the thickness of the wiring layer in is greater in the non-connecting section than in the connecting section. Thus, even when the flexible wiring substrate is folded, the wiring pattern can be prevented from being broken or exfoliated.

To solve the foregoing problems, a flexible wiring substrate of the present invention includes any one of the flexible wiring substrates described above, and a semiconductor element connected to the connecting section of the flexible wiring substrate. According to the above arrangement, the semiconductor device is arranged so that the wires can be designed with a fine pitch and its mechanical strength is improved.

To solve the foregoing problems, an electronic device of the present invention includes the semiconductor device. According to the above arrangement, the electronic device is arranged so that the wires can be designed with a fine pitch and its mechanical strength is improved.

To solve the foregoing problems, a fabricating method of the flexible wiring substrate of the present invention includes the steps of: (a) forming a wiring layer on an insulating layer; (b) patterning the wiring layer in a predetermined pattern; and (c) causing a thickness of the wiring layer in a portion where an electronic component is connected to be thinner than that of the rest of the wiring layer.

According to the above arrangement, the step (c) causes the thickness of the wiring pattern in the portion, where the electronic component is connected, on the wiring layer to be thinner than that of the rest of the wiring layer. This structure facilitates fabrication of the portion where the electronic component is connected. Thus, for example, when the wires are etched, the wires can be etched so as to have a good shape. Further, a variation in thickness of the wires can be reduced. This realizes a fine pitch of the wiring pattern.

Further, mechanical strength of the wiring layer can be improved because the thickness of the wiring layer is greater in a portion where the electronic component is not connected than in the portion where the electronic component is connected. Thus, such a flexible wiring substrate can be fabricated in which the wiring pattern can be prevented from being broken or exfoliated, even when the flexible wiring substrate is folded.

To solve the foregoing problems, a fabricating method of the flexible wiring substrate of the present invention includes the steps of: (a) forming a wiring layer on an insulating layer; and (b) forming the wiring layer to have a predetermined pattern, the step (a) including: (i) forming a first wiring layer; and (ii) forming a second wiring layer in a portion, where an electronic component is not connected to the first wiring layer, on the first wiring layer.

According to the above arrangement, the second wiring layer is formed in the portion, where the first wiring layer is not connected to the electronic component, on the first wiring layer. That is, the thickness of the wiring layer is less in the portion where the electronic component is connected than in the rest of the wiring layer. This structure facilitates fabrication of the portion where the electronic component is connected.

Thus, for example, when the wires are etched, the wires can be etched so as to have a good shape. Further, a variation in thickness of the wires can be reduced. This realizes a fine pitch of the wiring pattern.

Further, mechanical strength of the wiring layer can be improved because the thickness of the wiring layer is greater in the portion where the electronic component is not connected than in the portion where the electronic component is connected. Thus, even when the flexible wiring substrate is folded, the wiring pattern can be prevented from being broken or exfoliated.

Additional objects, features, and strengths of the present invention will be made clear by the description below. Further, the advantages of the present invention will be evident from the following explanation in reference to the drawings.

BRIEF DESCRIPTION OF THE DRAWINGS

FIGS. 21(a) through 20(d) are cross-sectional views schematically illustrating arrangements of a fabricating method of the semiconductor device according to still another embodiment of the present invention.

DESCRIPTION OF THE EMBODIMENTS

First Embodiment

Figure 1:
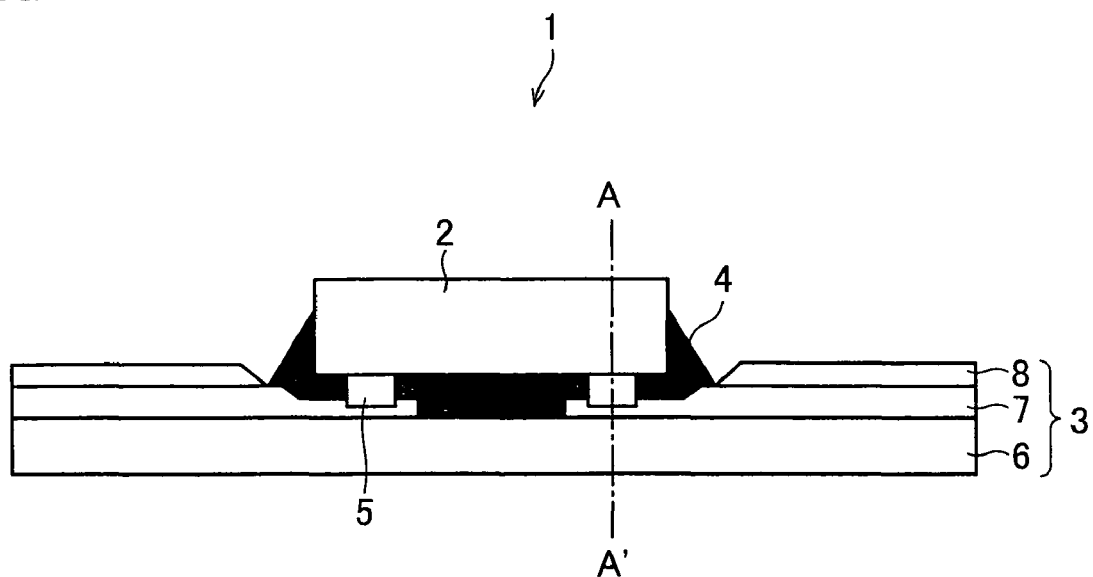
FIG. 1 is a cross-sectional view schematically illustrating a structure of a semiconductor device according to one embodiment of the present invention.
Figure 2:
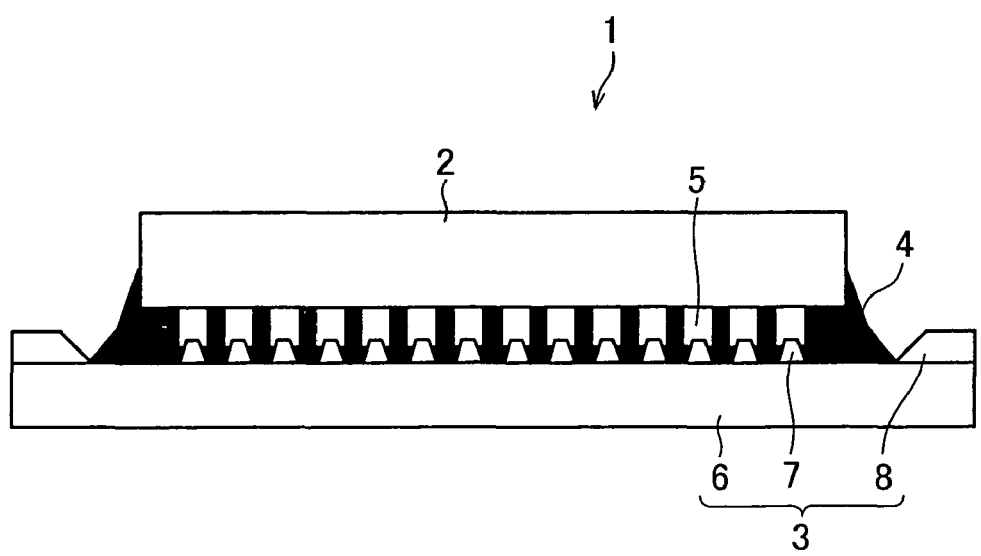
FIG. 2 is a cross-sectional view schematically illustrating a structure of the semiconductor device taken along line A-A' of FIG. 1 according to one embodiment of the present invention.

With reference to FIGS. 1 through 4(d), a first embodiment of the present invention is described below. FIG. 1 is a cross-sectional view schematically illustrating a structure of a semiconductor device of the present embodiment. Further, FIG. 2 is a cross-sectional view schematically illustrating the structure of the semiconductor device taken along line A-A' of FIG. 1.

As illustrated in FIGS. 1 and 2, the semiconductor device 1 includes a semiconductor element (electronic component) 2 and a tape carrier (flexible wiring substrate) 3. The semiconductor element 2 is connected to the tape carrier 3. That is, the semiconductor element 2 is mounted on the tape carrier 3. Further, a gap between the tape carrier 3 and the semiconductor element 2 is sealed with an insulation resin 4. The present embodiment discusses, as an example, a COF-type semiconductor device having the above structure, in which the semiconductor element 2 is mounted on the tape carrier 3.

An example of the semiconductor element 2 is an integrated circuit (LSI: large scaled integrated circuit) for use in a CPU (central processing unit), memory, or the like. Further, the semiconductor element 2 has a plurality of protruding electrodes 5.

The protruding electrodes 5 are disposed on a surface which faces the tape carrier 3 when mounting the semiconductor element 2 on the tape carrier 3. The protruding electrodes 5 are protruded in a substantially vertical direction with respect to the surface and used to establish electric connection between the semiconductor element 2 and the tape carrier 3. As long as the protruding electrodes 5 are made of an electrically conductive material, the protruding electrodes 5 may be arranged in any way. Further, each of the protruding electrodes 5 is preferably formed in a shape that facilitates the connection with the tape carrier 3, though the shape is not limited. The protruding electrodes 5 may be made of, for example, Au or solder with a shape of a ball, a cylinder, or a rectangular column.

The tape carrier 3 serves as a base to/on which the semiconductor element 2 is to be connected and mounted. The tape carrier 3 includes an insulation tape (insulating layer) 6, a wiring pattern (wiring layer, pattern) 7, and a solder resist 8.

The insulation tape 6 is a base material on a surface of which the wiring pattern 7 is to be disposed. The insulation tape 6 needs to be insulative. Further, the insulation tape 6 needs to be highly flexible (flexure) so as to be flexibly folded, because it is used in various shapes. To this end, the insulation tape 6 is made of a resin material such as polyimide, glass epoxy, polyester, or the like, for example. In the present embodiment, the insulation tape 6 made of a polyimide resin is described by way of example.

Further, it is preferable that the insulation tape 6 be a base material in a thin film tape-like shape for ease of its folding and reduction in size and thickness of the semiconductor device 1. It is preferable that the thickness of the insulation tape 6 be within a range from 15 μm to 40 μm for example, though the thickness can be suitably set depending on its intended use.

The wiring pattern 7 is formed in a pattern on a surface of the insulation tape 6. The wiring pattern 7 is formed by forming copper foil or spattered copper (hereinafter referred to as "copper foil") on the insulation tape 6 using a casting method, a spattering method (metallizing method) or the like, and then etching the copper foil so as to have a desirable pattern. In the present embodiment, the wiring pattern 7 made of copper is described by way of example. However, the material of the wiring pattern 7 is not limited to the example and may be a metal having a conducting characteristic such as silver or the like.

Note that, the wiring pattern 7 has an external connection terminal (not shown) for connecting the semiconductor device 1 to another electronic component. Further, tin-based plating or Au-based plating (not shown) is applied to a surface of the wiring pattern 7. The specific structure of the wiring pattern 7 will be described later.

The solder resist 8 is formed on the wiring pattern 7. The solder resist 8 is made of e.g. a heat-resistant coating material, and serves to prevent the wiring pattern from being not covered in portions other than the connecting sections. Thus, the solder resist 8 is formed in (a) portions excluding a region where the semiconductor element 2 is mounted, and (b) portions where the external connection terminal is not provided. That is, the solder resist 8 is formed on that part of the wiring pattern 7 which is not covered with the semiconductor element 2 or the like when the semiconductor element 2 or the like is connected to and mounted on the tape carrier 3.

The insulation tape 6 has no opening section for mounting the semiconductor element 2. Therefore, the semiconductor element 2 is connected to and mounted on the insulation tape 6 by performing bonding between the protruding electrodes 5 disposed on the semiconductor element 2 and the wiring pattern 7 formed on the surface of the insulation tape 6. That is, wires of the wiring pattern 7 disposed on the surface of the insulation tape 6 are bonded to the corresponding protruding electrodes 5 disposed on the semiconductor element 2. In this way, the wiring pattern 7 and the semiconductor element 2 are electrically connected.

The wiring pattern 7 has a various thickness depending on its position. Specifically, the thickness of the wiring pattern 7 is less in a region where the semiconductor element 2 is connected and mounted (mounting region: connecting section) than in a region where the semiconductor element 2 is not connected and mounted (non-mounting region). With the foregoing structure, the wiring pattern 7 can be designed with a fine pitch in the mounting region. Further, mechanical strength of the non-mounting region is improved, and thereby the strength of the semiconductor device 1 is also improved.

The mounting region is a region where the semiconductor element 2 is connected to and mounted on the wiring pattern 7. That is, the mounting region, in which the protruding electrodes 5 are bonded to the wiring pattern 7, refers to a region where the semiconductor element 2 covers the tape carrier 3 when the tape carrier 2 is mounted on the tape carrier 3. Thus, the wiring pattern 7 connected to the semiconductor element 2 in the mounting region is so-called inner lead. The non-mounting region is a region other than the mounting region.

Further, the "connecting sections" refer to portions where the semiconductor element 2 is connected to the wiring pattern 7. On the other hand, the "non-connecting sections" refer to regions other than the connecting sections. In the present embodiment, the connecting sections are contained within the mounting region.

It is preferable that the thickness of the wiring pattern 7 in the mounting region be in a range from 3 μm to 6 μm, for example. The thickness of the wiring pattern 7 below 3 μm may be result in a problem in that the protruding electrodes 5 gets in contact with the surface of the insulation tape 6. On the other hand, when the thickness of the wiring pattern 7 is greater than 6 μm, it will be difficult to etch the wiring pattern 7 in a good shape for excellent bonding with the semiconductor element 2.

It should be noted that the thickness of the wiring pattern 7 in the mounting region is not limited to the above thickness. That is, the thickness of the wiring pattern 7 may allow the wiring pattern 7 to be designed with a fine pitch. In other words, the thickness of the wiring pattern 7 may allow the wiring pattern 7 to be formed in a good shape by etching, while preventing the protruding electrodes 5 from contacting the insulation tape 6.

Further, the wiring pattern 7 is more effective when a wiring pitch, i.e., an interval of the wires, is below 35 μm. When the wiring pitch is below 35 μm, the tape carrier 3 is regarded as a fine-pitch carrier.

Figure 3:
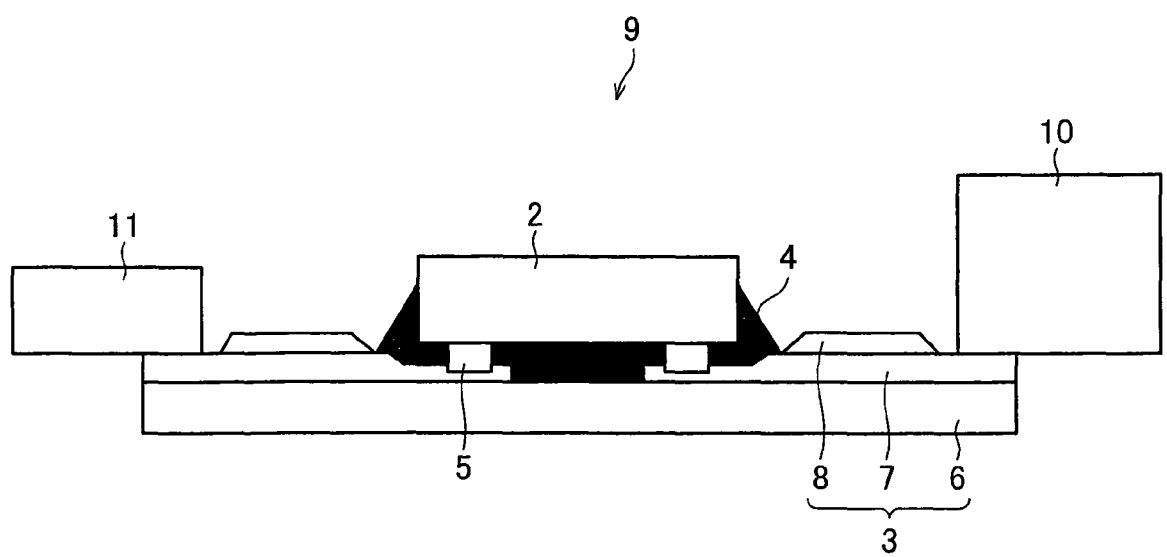
FIG. 3 is a cross-sectional view schematically illustrating a structure of a semiconductor module according to one embodiment of the present invention.

Note that, the semiconductor device 1 may serve as a semiconductor module (electronic device) 9 by being connected to another electronic component. In the semiconductor module 9, for example, the semiconductor device 1 can drive and control another electronic component. FIG. 3 is a cross-sectional view schematically illustrating a structure of the semiconductor module 9 of the present embodiment. In FIG. 3, the semiconductor device 1 is used in a liquid crystal display. In this structure, another electronic component is a liquid crystal panel 10 and a printed board 11. In the semiconductor module 9, the external connection terminal of the wiring pattern 7 in the semiconductor device 1 is connected to the liquid crystal panel 10, the printed board 11, or the like.

Figure 4:
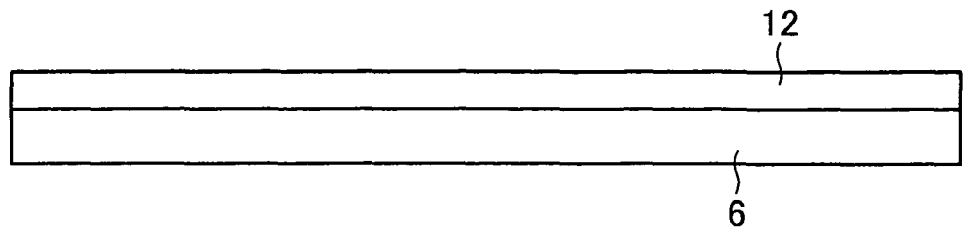
FIGS. 4(a) through 4(d) are cross-sectional views schematically illustrating arrangements of a fabricating method of a semiconductor device according to one embodiment of the present invention.
Figure 4:
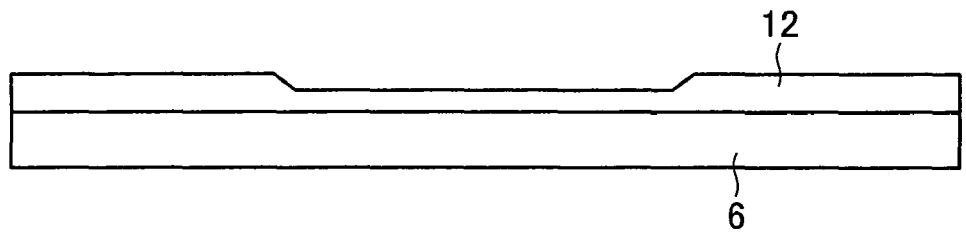
Figure 4:
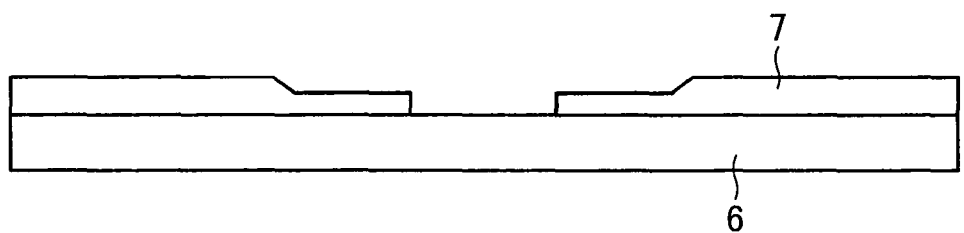
Figure 4:
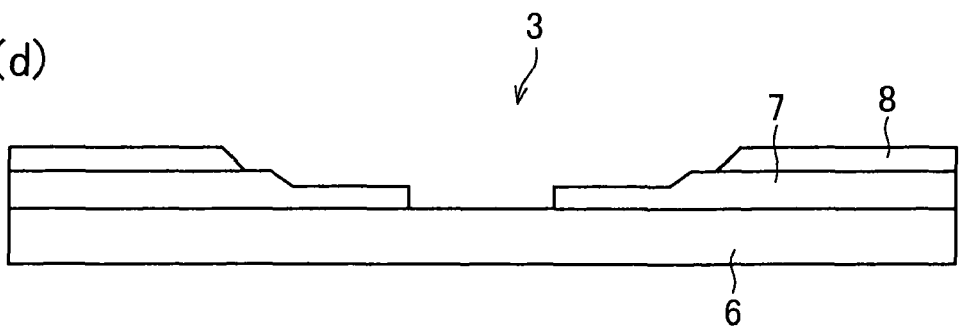

With reference to FIGS. 4(*a*) through 4(*d*), described next is a fabricating method of the semiconductor device 1 having the above structure. FIGS. 4(*a*) through 4(*d*) are cross-sectional views schematically illustrating structures of the fabricating method of the semiconductor device 1. The fabricating method of the semiconductor device 1 of the present embodiment includes causing, by applying half etching, a thickness of the copper foil disposed on the insulation tape 6 in the mounting region to be less than that in the non-mounting region, before the formation of form the wiring pattern 7 by etching the copper foil.

First, as illustrated in FIG. 4(*a*), a copper foil (wiring layer) 12 is formed on the surface of the insulation tape 6 by the casting method, the spattering method (metallizing method), or the like so as to have a thickness of 8 μm to 18 μm. In the casting method, polyimide is applied over the copper foil and then hardened. On the other hand, in the spattering method (metallizing method), a metal seed layer is first formed on a film made of polyimide, kapton, or the like by spattering. Then, copper-based plating is deposited on the metal seed layer by electroplating.

Next, as illustrated in FIG. 4(*b*), etching is applied to a portion on a surface of the copper foil 12. This portion corresponds to the mounting region. As a result, the thickness of the copper foil becomes less in the mounting region than in the non-mounting region. Hereinafter, this etching is sometimes referred to as half etching.

By applying half etching, the thickness of the copper foil 12 can be controlled so that a desirable thickness is realized in the mounting region. For example, the thickness can be controlled by using tape-surface etching equipment, adjusting a temperature, time, speed, and/or the like.

Then, as illustrated in FIG. 4(*c*), the wiring pattern 7 is formed in a desirable pattern by etching the copper foil 12 so that the copper foil 12 has a predetermined pattern. The wiring pattern 7 is formed in all regions where the wiring pattern 7 should be formed (the mounting region and the non-mounting region). Then, as illustrated in FIG. 4(*d*), the solder resist 8 is applied to those portions of the wiring pattern 7, which will not be covered with the semiconductor element 2 when the semiconductor element 2 is mounted in a subsequent step. In this manner, the tape carrier 3 is fabricated.

Further, the semiconductor element 2 is connected to and mounted on the tape carrier 3 fabricated in the manner described above. First, the semiconductor element 2 and the tape carrier 3 are disposed so that the protruding electrodes 5 and the wiring pattern 7 face to each other. Then, the protruding electrodes 5 are bonded to the wiring pattern 7. The bonding can be performed by Au—Sn eutectic bonding, for example. In this way, the semiconductor element 2 is connected to and mounted on the tape carrier 3.

After the semiconductor element 2 is connected to and mounted on the tape carrier 3, the insulation resin 4 is injected in the gap between the semiconductor element 2 and the tape carrier 3, so as to seal the gap. By injecting the insulation resin 4 and sealing the gap, the portion, where the semiconductor element 2 and the wiring pattern 7 are bonded, can be securely insulated from the outside. In this manner, the semiconductor device 1 of the present embodiment is fabricated.

When the semiconductor device 1 is connected to another electronic component, a liquid crystal panel, a printed board, or the like for example may be connected to the external connection terminal of the wiring pattern 7.

As described above, in the tape carrier 3 used in a COF-type semiconductor device according to the present embodiment, the thickness of the wiring pattern 7 is less in the mounting region than in the non-mounting region. Specifically, the thickness of the wiring pattern 7 in the non-mounting region is in a range from 8 μm to 18 μm, while the thickness of the wiring pattern 7 in the mounting region is in a range from 3 μm to 6 μm.

With the foregoing structure, compared to the conventional tape carrier used, in a COF-type semiconductor device, the wiring pattern 7 can be formed in a preferable pattern by etching. In addition, excellent bonding is attained between the semiconductor element 2 and the wiring pattern 7. Further, mechanical strength of the wiring pattern 7 in the non-mounting region is improved, so that failures due to breaks or exfoliation of the wiring pattern 7 can be reduced to 50% or less compared to a conventional wiring pattern.

Second Embodiment

With reference to FIGS. 1 through 3 and 5(*d*), a second embodiment of the present invention is described below. FIG. 1 is a cross-sectional view schematically illustrating a structure of a semiconductor device of the present embodiment. Further, FIG. 2 is a cross-sectional view schematically illustrating a structure of the semiconductor device taken along line A-A' of FIG. 1.

As illustrated in FIG. 1, the semiconductor device 1 includes a semiconductor element 2 and a tape carrier 3. Compared to the first embodiment, the present embodiment describes a different fabricating method of the semiconductor device 1, though the structure of the semiconductor device 1 is the same. Thus, constituting elements having the same functions as those described in the first embodiment are indicated by the same reference numerals, and their explanations are omitted. In the present embodiment, the fabricating method of the semiconductor device 1 is mainly described. Further, the terms used in the first embodiment have the same meaning also in the present embodiment, unless otherwise specified.

Figure 5:
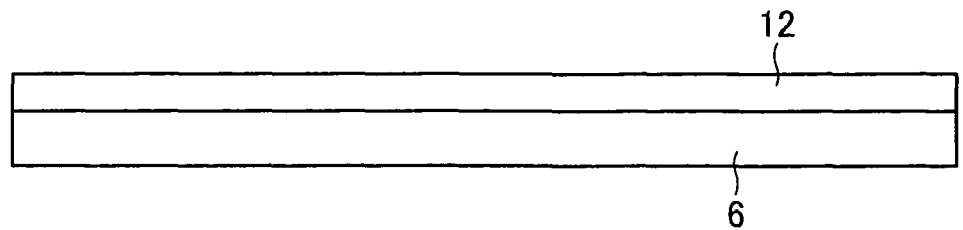
FIGS. 5(a) through 5(d) are cross-sectional views schematically illustrating structures of a semiconductor device according to another embodiment of the present invention.
Figure 5:
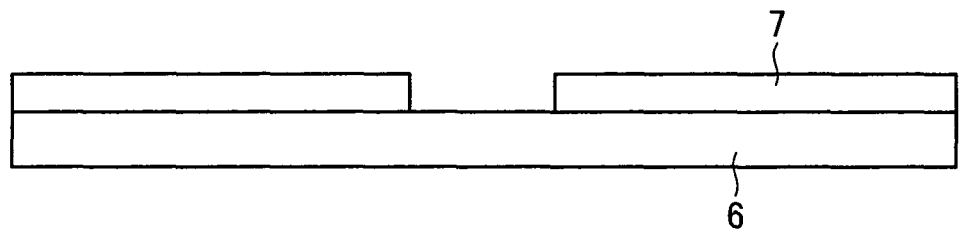
Figure 5:
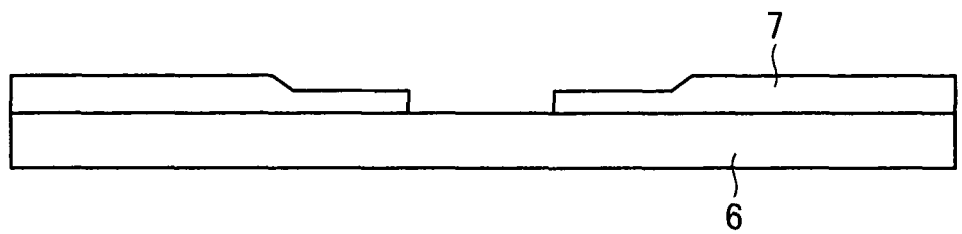
Figure 5:
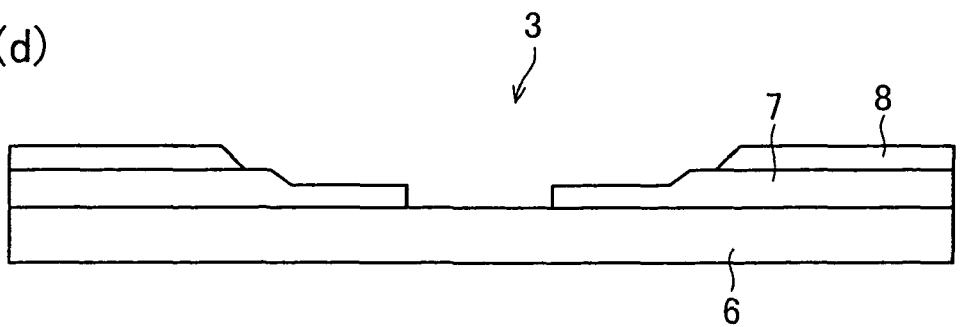

With reference to FIGS. 5(*a*) through 5(*d*), the fabricating method of the semiconductor device 1 of the present embodiment is described in more detail. FIGS. 5(*a*) through 5(*d*) are cross-sectional views schematically illustrating structures of the semiconductor device 1 of the present embodiment.

The fabricating method of the semiconductor device 1 of the present embodiment includes reducing, by applying half etching, a thickness of copper foil disposed on a surface of an insulation tape 6 in a mounting region to be less than that in a non-mounting region, after etching the copper foil so as to form a wiring pattern 7.

First, as illustrated in FIG. 5(*a*), a copper foil 12 is formed on the surface of the insulation tape 6 by the casting method, the spattering method (metallizing method), or the like so as to have a thickness of 8 μm to 18 μm.

Next, as illustrated in FIG. 5(*b*), the wiring pattern 7 is formed in a desirable pattern by etching the copper foil 12 so that the copper foil 12 has a predetermined pattern. The wiring pattern 7 is formed in all regions where the wiring pattern 7 should be formed (the regions include the mounting region and the non-mounting region).

Further, as illustrated in FIG. 5(*c*), etching, i.e., half etching, is applied to a portion on a surface of the wiring pattern 7. This portion corresponds to the mounting region. That is, the etching is applied so that a thickness of the wiring pattern 7 is less in the mounting region than in the non-mounting region. Then, as illustrated in FIG. 5(*d*), a solder resist 8 is applied to portions of the wiring pattern 7, which will not be covered when the semiconductor element 2 is mounted in a subsequent step. In this manner, the tape carrier 3 is fabricated.

Next, as in the case of the first embodiment, the semiconductor element 2 is connected to and mounted on the tape carrier 3. After the semiconductor element 2 is connected to and mounted on the tape carrier 3, the insulation resin 4 is injected in a gap between the semiconductor element 2 and the tape carrier 3, so as to seal the gap. In this way, the semiconductor device 1 of the present embodiment is fabricated.

Note that, when the semiconductor device 1 is connected to another electronic component and serves as the semiconductor module 9, as illustrated in FIG. 3, a liquid crystal panel, a printed board, or the like for example may be connected to an external connection terminal of the wiring pattern 7.

As described above, in the tape carrier 3 used in a COF-type semiconductor device according to the present embodiment, the thickness of the wiring pattern 7 is less in the mounting region than in the non-mounting region. Specifically, the thickness of the wiring pattern 7 in the non-mounting region is in a range from 8 μm to 18 μm, while the thickness of the wiring pattern 7 in the mounting region is in a range from 3 μm to 6 μm.

With the foregoing structure, compared to the conventional tape carrier used in a COF-type semiconductor device, the wiring pattern 7 can be formed in a preferable pattern by etching. In addition, excellent bonding is attained between the semiconductor element 2 and the wiring pattern 7. Further, mechanical strength of the wiring pattern 7 in the non-mounting region is improved, so that failures due to breaks or exfoliation of the wiring pattern 7 can be reduced to 50% or less compared to a conventional wiring pattern.

Further, in the tape carrier 3 of the present embodiment, after the wiring pattern 7 is formed by etching, the thickness of the wiring pattern 7 in the mounting region is reduced by applying half etching. Accordingly, compared to the tape carrier 3 of the first embodiment, the thickness of the wiring pattern 7 can be equalized in the mounting region.

Third Embodiment

Figure 6:
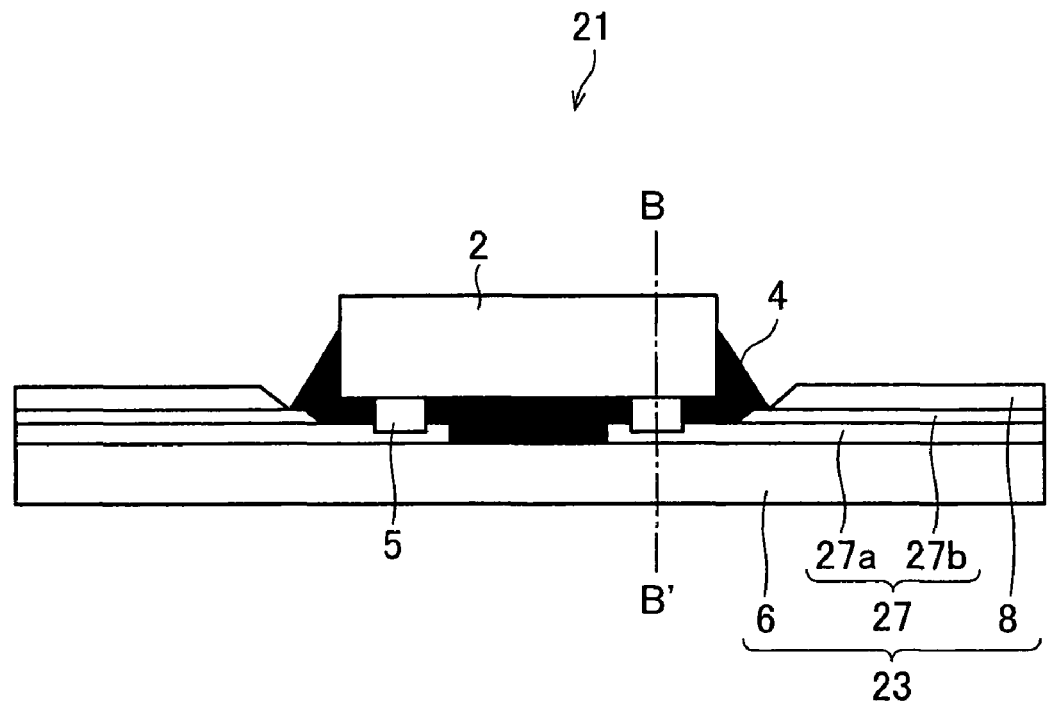
FIG. 6 is a cross-sectional view schematically illustrating a structure of a semiconductor device according to still another embodiment of the present invention.
Figure 7:
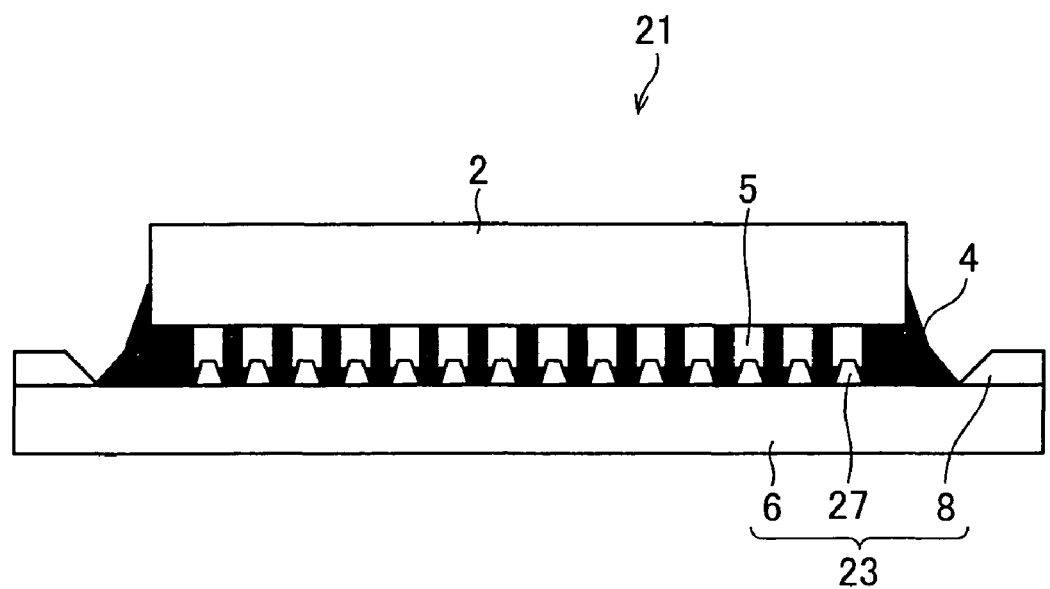
FIG. 7 is a cross-sectional view schematically illustrating a structure of the semiconductor device taken along line B-B' of FIG. 6 according to still another embodiment of the present invention.

With reference to FIGS. 6 through 9(*d*), a third embodiment of the present invention is described below. FIG. 6 is a cross-sectional view schematically illustrating a structure of a semiconductor device of the present embodiment. Further, FIG. 7 is a cross-sectional view schematically illustrating a structure of the semiconductor device taken along line B-B' of FIG. 6.

As illustrated in FIGS. 6 and 7, a semiconductor device 21 includes a semiconductor element 2 and a tape carrier (flexible wiring substrate) 23. The semiconductor element 2 is connected to and mounted on the tape carrier 23. Further, an insulation resin 4 is completely filled in a gap between the tape carrier 23 and the semiconductor element 2. The present embodiment discusses, as an example, a COF-type semiconductor apparatus having a structure in which the semiconductor element 2 is mounted on the tape carrier 23. Note that, constituting elements having the same functions as those described in the first and second embodiments are indicated by the same reference numerals, and their explanations are omitted. Further, the terms used in the first embodiment mean the same also in the present embodiment, unless otherwise specified.

The semiconductor element 2 has a plurality of protruding electrodes 5, and the tape carrier 23 serves as a base to/on which the semiconductor element 2 is to be connected and mounted. The tape carrier 23 includes an insulation tape (insulating layer) 6, a wiring pattern (wiring layer, pattern) 27, and a solder resist 8.

The wiring pattern 27 is formed in a pattern on a surface of the insulation tape 6. The wiring pattern 27 is formed by forming copper foil or spattered copper (hereinafter referred to as "copper foil") on the insulation tape 6 using the casting method, the spattering method (metallizing method) or the like, and then etching the copper foil so as to have a desirable pattern. In the present embodiment, the wiring pattern 27 made of copper is described by way of example. However, the material of the wiring pattern 27 is not limited to the example and may be a metal having a conducting characteristic such as silver or the like.

The wiring pattern 27 includes a first wiring layer 27a and a second wiring layer 27b. The first wiring layer 27a is made of copper foil disposed on the insulation tape 6, and the second wiring layer 27b is made of copper foil disposed on the first wiring layer 27a.

The second wiring layer 27b is disposed on part of the first wiring layer 27a. In the present embodiment, the second wiring layer 27b is disposed in the non-mounting region on the first wiring layer 27a. That is, a thickness of the wiring pattern 27 is greater in the non-mounting region than in the mounting region. Thus, controlling a thickness of the first wiring layer 27a enables the wiring pattern 7 to be designed with a fine pitch. Further, controlling a thickness of the second wiring layer 27b improves mechanical strength of the wiring pattern 27.

It is preferable that the thickness of the first wiring layer 27a be in a range from 3 μm to 6 μm, for example. When the thickness of the first wiring layer 27a is below 3 μm, the protruding electrodes 5 may result in contacting a surface of the insulation tape 6. On the other hand, when the thickness of the first wiring layer 27a is greater than 6 μm, it will be difficult to etch the wiring pattern 27 in a good shape for excellent bonding with the semiconductor element 2.

Further, the thickness of the second wiring layer 27b may be suitably set according to the thickness of the first wiring layer 27a. For example, when the thickness of the first wiring layer 27a is in a range from 3 μm to 6 μm, it is preferable that the total thickness of the first wiring layer 27a and the second wiring layer 27b be in a range from 8 μm to 18 μm.

It should be noted that the thickness of the first wiring layer 27a is not limited to the above thickness. That is, the thickness of the first wiring layer 27a may allow the wiring pattern 27 to be designed with a fine pitch. In other words, the thickness of the first wiring layer 27a may allow the wiring pattern 27 to be formed in a good shape by etching, while preventing the protruding electrodes 5 from contacting the insulation tape 6.

Further, the thickness of the second wiring layer 27b is not limited to the above thickness. It is merely necessary for the second wiring layer 27b to have a thickness providing sufficient mechanical strength in combination with the thickness of the first wiring layer 27a.

Further, the wiring pattern 27 is more effective when a wiring pitch, i.e., an interval of the wires, is below 35 μm. When the wiring pitch is below 35 μm, the tape carrier 3 is regarded as a fine-pitch carrier.

Note that, the wiring pattern 7 has an external connection terminal (not shown) for connecting the semiconductor device 21 to another electronic component. Further, tin-based plating or Au-based plating (not shown) is applied to a surface of the wiring pattern 27.

The insulation tape 6 has no opening section for mounting the semiconductor element 21. Therefore, the semiconductor element 21 is connected to and mounted on the insulation tape 6 by performing bonding between the protruding electrodes 5 disposed on the semiconductor element 21 and the wiring pattern 27 formed on the surface of the insulation tape 6. That is, the wires of the wiring pattern 27 disposed on the surface of the insulation tape 6 are bonded to the corresponding protruding electrodes 5 disposed on the semiconductor element 21. In this way, the wiring pattern 27 and the semiconductor element 21 are electrically connected.

Figure 8:
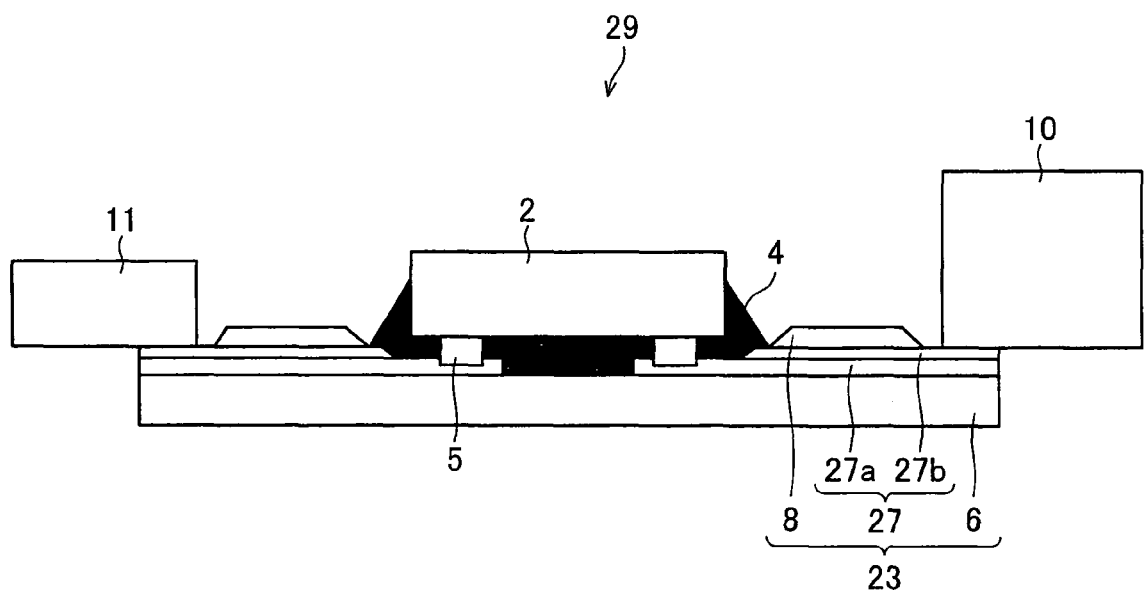
FIG. 8 is a cross-sectional view schematically illustrating a structure of a semiconductor module according to still another embodiment of the present invention.

Note that, the semiconductor device 21 may serve as a semiconductor module (electronic device) 29 by being connected to another electronic component. In the semiconductor module 29, for example, the semiconductor device 21 can drive and control another electronic component. FIG. 8 is a cross-sectional view schematically illustrating a structure of the semiconductor module 9 of the present embodiment. FIG. 8 illustrates a structure in which the semiconductor device 21 is used in a liquid crystal display. In this structure, another, electronic component is a liquid crystal panel 10 and a printed board 11. In the semiconductor module 29, the external connection terminal of the wiring pattern 27 in the semiconductor device 21 is connected to the liquid crystal panel 10, a printed board 11, or the like.

Figure 9:
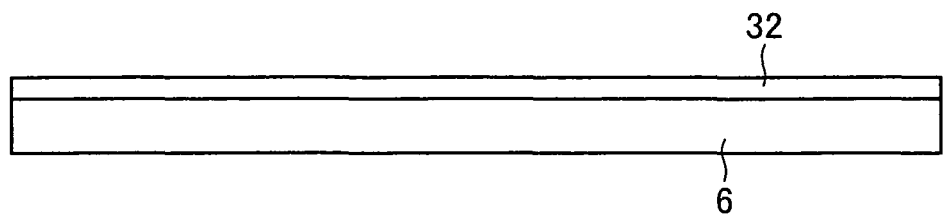
FIGS. 9(a) through 9(d) are cross-sectional views schematically illustrating arrangements of a fabricating method of a semiconductor device according to still another embodiment of the present invention.
Figure 9:
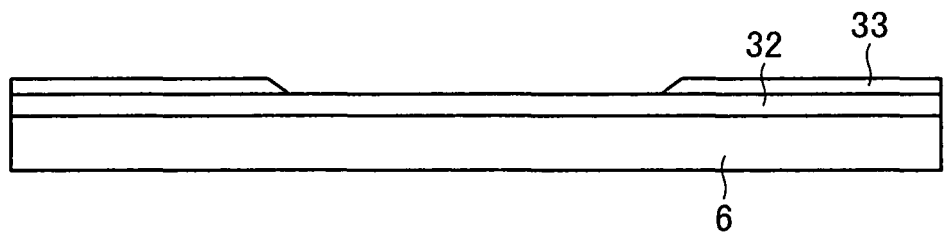
Figure 9:
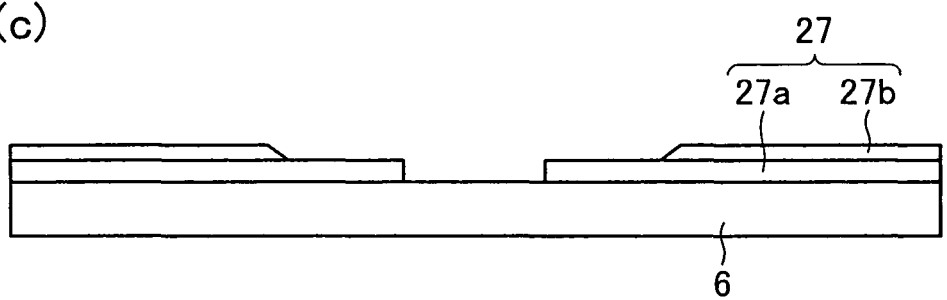
Figure 9:
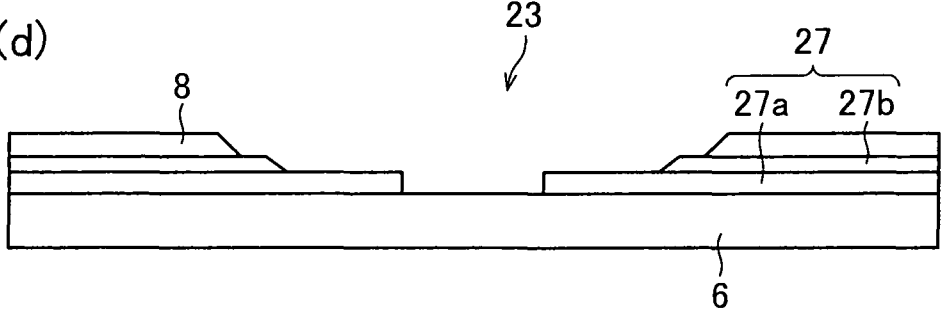

With reference to FIGS. 9(*a*) through 9(*d*), described next is a fabricating method of the semiconductor device 21 having the above structure. FIGS. 9(*a*) through 9(*d*) are cross-sectional views schematically illustrating arrangements of the fabricating method of the semiconductor device 21. The fabricating method of the semiconductor device 21 of the present embodiment includes increasing, by applying electroplating or the like, a thickness of the copper foil disposed on the insulation tape 6 in the non-mounting region to be greater than that in the mounting region, before etching the copper foil so as to form the wiring pattern 27.

First, as illustrated in FIG. 9(*a*), a first copper foil layer 32 is formed on the surface of the insulation tape 6 by the casting method, the spattering method (metallizing method), or the like so as to have a thickness of 3 μm to 6 μm. Then, as illustrated in FIG. 9(*b*), a second copper foil layer 33 is further disposed on a portion on the first copper foil layer 32. This portion corresponds to the non-mounting region.

The second copper foil layer 33 is formed by depositing the copper-based plating on the first copper foil layer 32 by electroplating for example. This enables the thickness of the copper foil to be varied between the mounting region and the non-mounting region. When the second copper foil layer 33 is formed by electroplating, the thickness of the second copper foil layer 33 can be arbitrary controlled. Accordingly, the thickness of the second copper foil layer 33 can be suitably varied depending on the thickness of the first copper foil layer 32. Thus, the second copper foil layer 33 is easily formed so that the total thickness of the first copper foil layer 32 and the second copper foil layer 33 is in a range from 8 μm to 18 μm, for example.

Further, as illustrated in FIG. 9(*c*), the wiring pattern 27 is formed in a desirable pattern by etching the first copper foil layer 32 and the second copper foil layer 33 so that the first copper foil layer 32 and the second copper foil layer 33 have a predetermined pattern. In this way, the wiring pattern 27 is formed, which includes the first copper foil layer 32 and the second copper foil layer 33. The wiring pattern 27 is formed in all regions where the wiring pattern 27 should be formed (the mounting region and the non-mounting region).

Then, as illustrated in FIG. 9(*d*), the solder resist 8 is applied to portions of the wiring pattern 27, which will not be covered when a semiconductor element 2 is mounted in a subsequent step. In this manner, the tape carrier 23 is fabricated.

Next, the semiconductor element 2 is connected to and mounted on the tape carrier 23 fabricated in the manner described above. First, the semiconductor element 2 and the tape carrier 23 are disposed so that the protruding electrodes 5 and the wiring pattern 27 face to each other. Then, the protruding electrodes 5 are bonded to the wiring pattern 27.

The bonding can be performed by Au—Sn eutectic bonding, for example. In this way, the semiconductor element 2 is connected to and mounted on the tape carrier 23.

After the semiconductor element 2 is connected to and mounted on the tape carrier 23, the insulation resin 4 is injected in the gap between the semiconductor element 2 and the tape carrier 23, so as to seal the gap. By injecting the insulation resin 4 and sealing the gap, the portion where the semiconductor element 2 and the wiring pattern 27 are bonded can be securely insulated from the outside. In this way, the semiconductor device 21 of the present embodiment is fabricated.

Note that, when the semiconductor device 21 is connected to another electronic component, a liquid crystal panel, a printed board, or the like for example may be connected to the external connection terminal of the wiring pattern 27.

As described above, in the tape carrier 23 used in a COF-type semiconductor device according to the present embodiment, the thickness of the wiring pattern 27 is greater in the non-mounting region than in the mounting region. Specifically, the thickness of the wiring pattern 27 in the mounting region is in a range from 3 μm to 6 μm, while the thickness of the wiring pattern 27 in the non-mounting region is in a range from 8 μm to 18 μm.

With the foregoing structure, compared to the conventional tape carrier used in a COF-type semiconductor device, the wiring pattern 27 can be formed in a good pattern by etching. In addition, excellent bonding is attained between the semiconductor element 2 and the wiring pattern 27. Further, mechanical strength of the wiring pattern 27 in the non-mounting region is improved, so that failures due to breaks or exfoliation of the wiring pattern 27 can be reduced to 50% or less compared to a conventional wiring pattern.

Fourth Embodiment

With reference to FIGS. 6 through 8 and 10(d), a fourth embodiment of the present invention is described below. FIG. 6 is a cross-sectional view schematically illustrating a structure of a semiconductor device of the present embodiment. Further, FIG. 7 is a cross-sectional view schematically illustrating a structure of the semiconductor device taken along line B-B' of FIG. 6.

As illustrated in FIG. 6, a semiconductor device 21 includes a semiconductor element 2 and a tape carrier 23. Compared to the third embodiment, the present embodiment describes a different fabricating method of the semiconductor device 21, though the structure of the semiconductor device 21 is the same. Thus, constituting elements having the same functions as those described in the third embodiment are indicated by the same reference numerals, and their explanations are omitted. In the present embodiment, the fabricating method of the semiconductor device 21 is mainly described. Further, the terms used in the third embodiment mean the same also in the present embodiment, unless otherwise specified.

With reference to FIGS. 10(a) through 10(d), the fabricating method of the semiconductor device 21 of the present embodiment is described in more detail. FIGS. 10(a) through 10(d) are cross-sectional views schematically illustrating arrangements of the semiconductor device 21 of the present embodiment.

The fabricating method of the semiconductor device 21 of the present embodiment includes increasing, by applying electroplating or the like, a thickness of copper foil disposed on a surface of an insulation tape 6 in non-mounting region to be greater than that in a mounting region, after etching the copper foil so as to form a wiring pattern 27.

Figure 10:
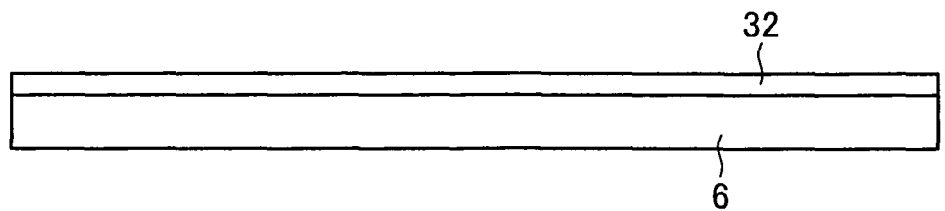
FIGS. 10(a) through 10(d) are cross-sectional views schematically illustrating arrangements of a fabricating method of a semiconductor device according to still another embodiment of the present invention.
Figure 10:
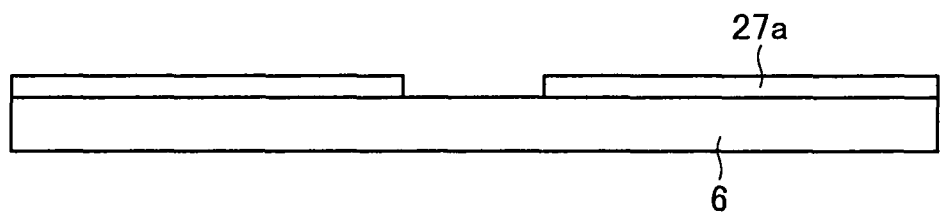
Figure 10:
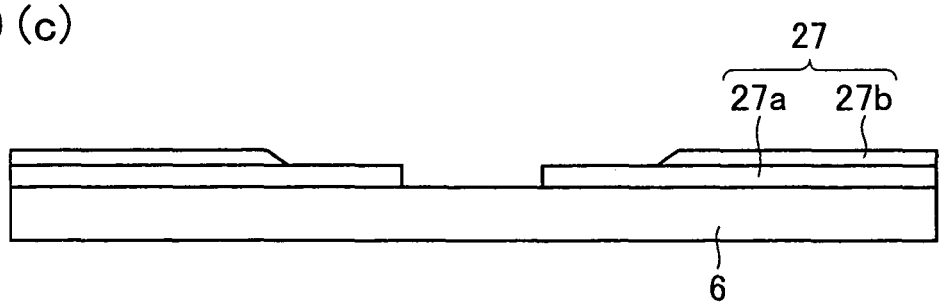
Figure 10:
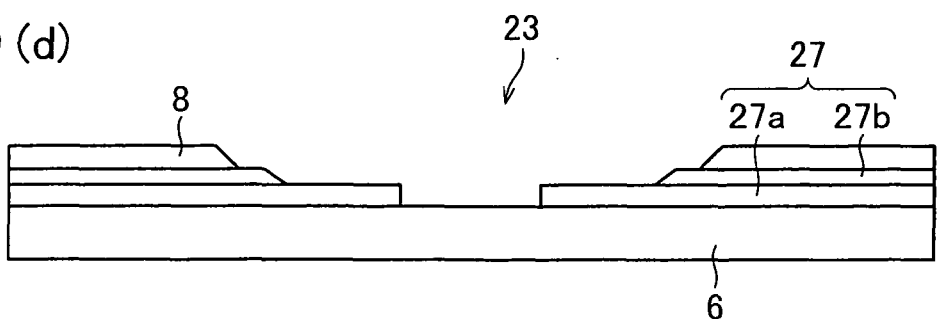
Figure 11:
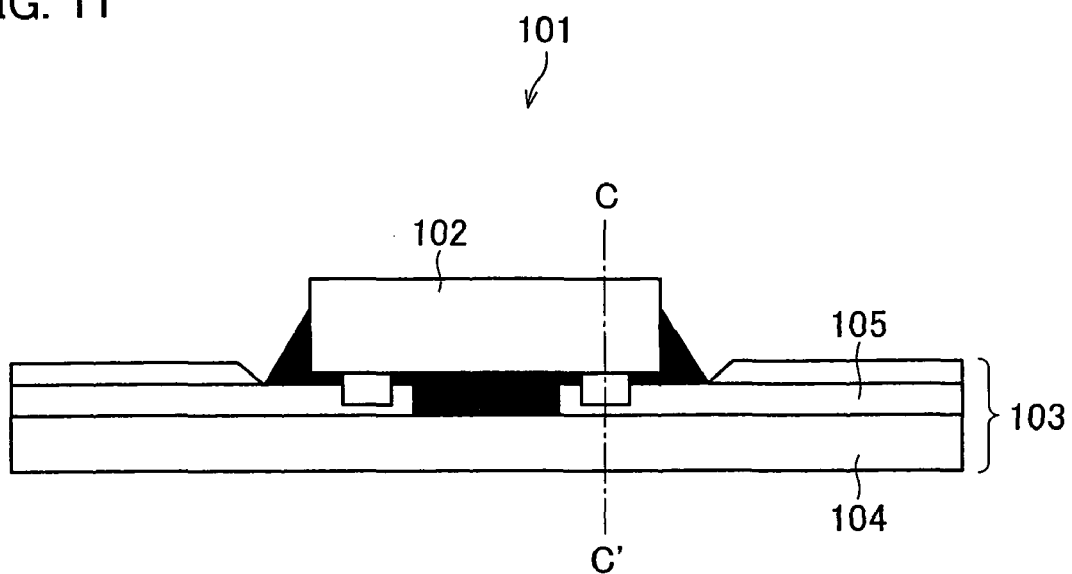
FIG. 11 is a cross-sectional view schematically illustrating a structure of a conventional semiconductor device.
Figure 12:
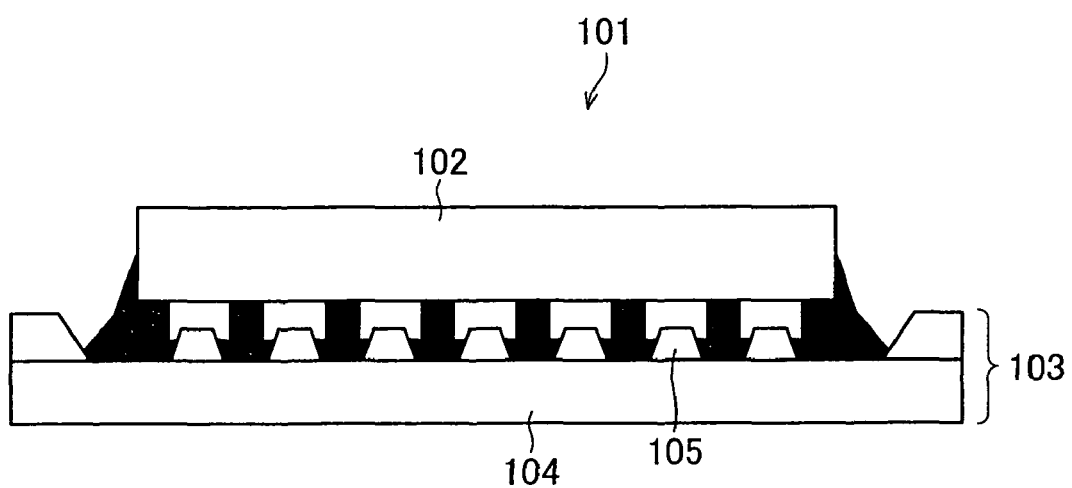
FIG. 12 is a cross-sectional view schematically illustrating a structure of the conventional semiconductor device.
Figure 13:
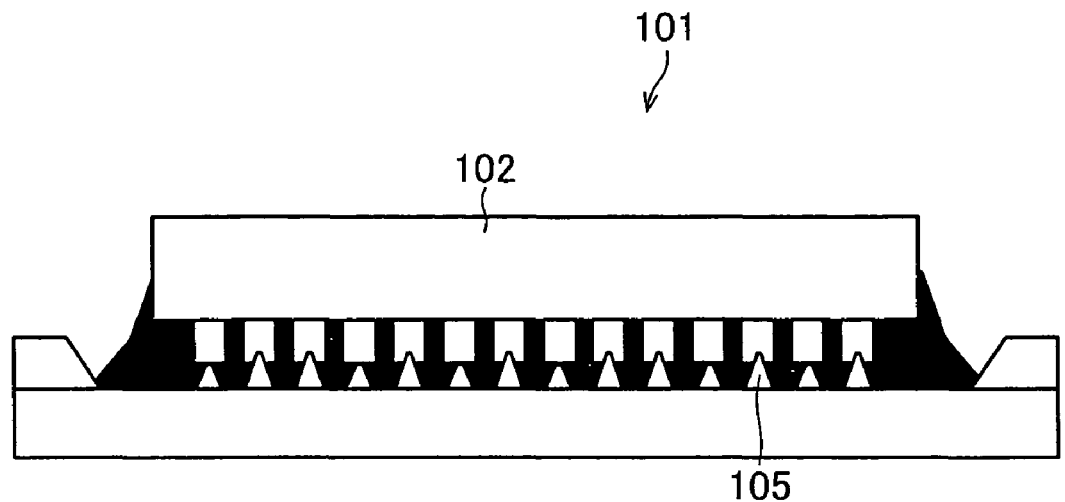
FIG. 13 is a cross-sectional view schematically illustrating a structure of the conventional semiconductor device.
Figure 14:
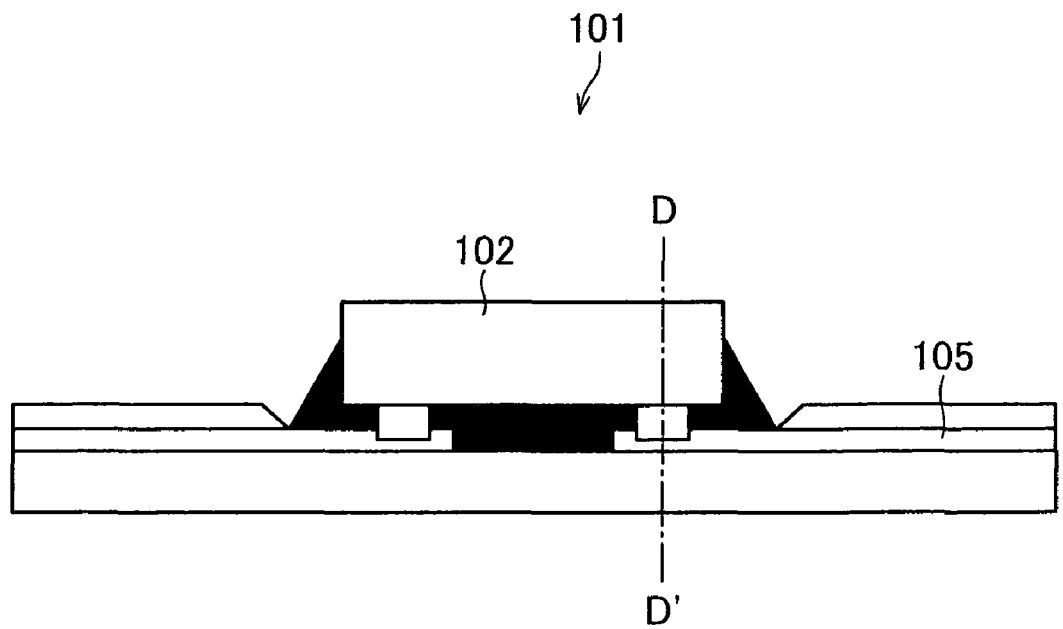
FIG. 14 is a cross-sectional view schematically illustrating a structure of the conventional semiconductor device.
Figure 15:
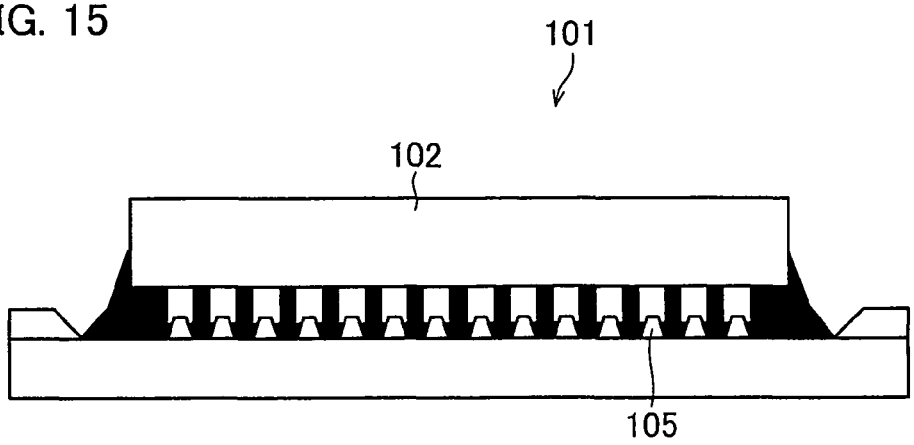
FIG. 15 is a cross-sectional view schematically illustrating a structure of the conventional semiconductor device.

First, as illustrated in FIG. 10(a), a first copper foil layer 32 is formed on the surface of the of the insulation tape 6 by the casting method, the spattering method (metallizing method), or the like so as to have a thickness of 3 μm to 6 μm.

Then, as illustrated in FIG. 10(b), a first wiring layer 27a is formed in a desirable pattern by etching the first copper foil layer 32 so that the first copper foil layer 32 has a predetermined pattern. In this way, the first wiring layer 27a is formed in all regions where the wiring pattern 27 should be formed (the mounting region and the non-mounting region).

Further, as illustrated in FIG. 10(c), a second wiring layer 27b is formed by further providing a copper foil on a portion on the first wiring layer 27a. This portion corresponds to the non-mounting region. In this way, the wiring pattern 27 is formed, which includes the first wiring layer 27a and the second wiring layer 27b. The first wiring layer 27a and the second wiring layer 27b are formed in a preferable shape by etching. The second wiring layer 27b is formed by depositing copper-based plating on the first wiring layer 27a by electroplating for example.

This enables a thickness of the wiring pattern 27 to be varied between the mounting region and the non-mounting region. Further, when the second wiring layer 27b is formed by electroplating a thickness of the second wiring layer 27b can be arbitrary controlled. Accordingly, the thickness of the second wiring layer 27b can be suitably varied depending on a thickness of the first wiring layer 27a. Thus, the second wiring layer 27b is easily formed so that the total thickness of the first wiring layer 27a and the second wiring layer 27b is in a range from 8 μm to 18 μm, for example.

Then, as illustrated in FIG. 10(d), a solder resist 8 is applied to portions of the wiring pattern 27, which will not be covered when a semiconductor element is mounted in a subsequent step. In this manner, the tape carrier 23 is fabricated.

Next, as in the case of the third embodiment, the semiconductor element 2 is connected to and mounted on the tape carrier 23. After the semiconductor element 2 is connected to and mounted on the tape carrier 23, the insulation resin 4 is injected in a gap between the semiconductor element 2 and the tape carrier 23, so as to seal the gap. In this way, the semiconductor device 21 of the present embodiment is fabricated.

Note that, in the same manner described in the third embodiment, when the semiconductor device 21 is connected to another electronic component and serves as a semiconductor module, as illustrated in FIG. 8, a liquid crystal panel 10, a printed board 11, or the like for example may be connected to an external connection terminal of the wiring pattern 27.

As described above, in the tape carrier 23 used in a COF-type semiconductor device according to the present embodiment, the thickness of the wiring pattern 27 is greater in the non-mounting region than in the mounting region. Specifically, the thickness of the wiring pattern 27 in the mounting region is in a range from 3 μm to 6 μm, while the thickness of the wiring pattern 27 in the non-mounting region is in a range from 8 μm to 18 μm.

With the foregoing structure, compared to the conventional tape carrier used in a COF-type semiconductor device, the wiring pattern 27 can be formed in a good pattern by etching. In addition, excellent bonding is attained between the semiconductor element 2 and the wiring pattern 27. Further, mechanical strength of the wiring pattern 27 in the non-mounting region is improved, so that failures due to breaks or exfoliation of the wiring pattern 27 can be reduced to 50% or less compared to a conventional wiring pattern.

Fifth Embodiment

Figure 16:
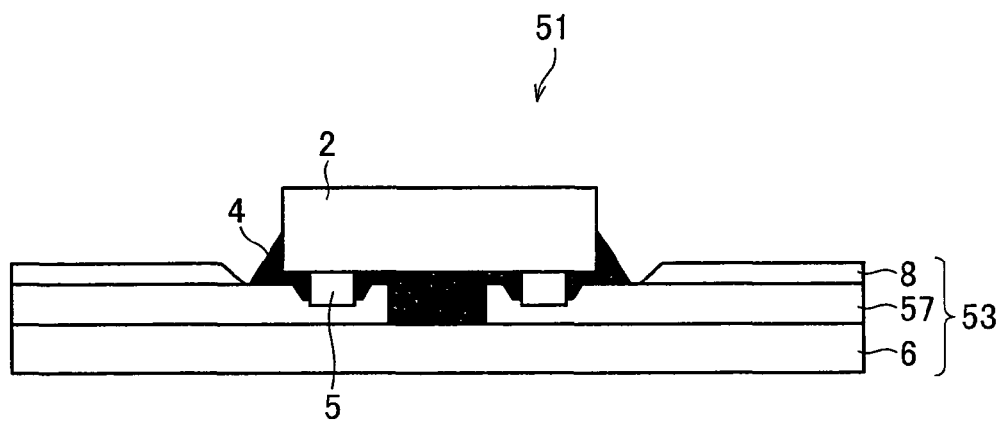
FIG. 16 is a cross-sectional view illustrating a semiconductor device according to still another embodiment of the present invention.

With reference to FIGS. 16 through 18(d), a fifth embodiment of the present invention is described below. FIG. 16 is a cross-sectional view schematically illustrating a structure of a semiconductor device of the present embodiment.

As illustrated in FIG. 16, a semiconductor device 51 includes a semiconductor element 2 and a tape carrier (flexible substrate) 53. The semiconductor element 2 is connected to and mounted on the tape carrier 53. Further, an insulation resin 4 is completely filled in a gap between the tape carrier 53 and the semiconductor element 2. The present embodiment discusses, as an example, a COF-type semiconductor apparatus having a structure in which the semiconductor element 2 is mounted on the tape carrier 53. Note that, constituting elements having the same functions as those described in the first embodiment is indicated by the same reference numerals, and their explanations are omitted. Further, the terms used in the first embodiment mean the same also in the present embodiment, unless otherwise specified.

The semiconductor element 2 has a plurality of protruding electrodes 5. Further, the tape carrier 53 serves as a base to/on which the semiconductor element 2 is to be connected and mounted. The tape carrier 53 includes an insulation tape (insulating layer) 6, a wiring pattern (wiring layer, pattern) 57, and a solder resist 8.

The wiring pattern 57 is formed in a pattern on a surface of the insulation tape 6. The wiring pattern 57 is formed by forming copper foil on the insulation tape 6 using the casting method, the spattering method (metallizing method) or the like, and then etching the copper foil so as to have a desirable pattern. In the present embodiment, the wiring pattern 57 made of copper is described by way of example. However, the material of the wiring pattern 57 is not limited to the example and may be a metal having a conducting characteristic such as silver or the like.

The wiring pattern 57 has a various thickness depending on its position. Specifically, a thickness of the wiring pattern 57 is less in portions where the semiconductor element 2 is connected and mounted (connecting sections) than in portions where the semiconductor element 2 is not connected and mounted (non-connecting sections). With the foregoing structure, the wiring pattern 57 can be designed with a fine pitch in the connecting sections. Further, mechanical strength of the non-connecting regions is improved, and thereby the strength of the semiconductor device 51 is also increased.

Further, in the present embodiment, the thickness of the wiring pattern 57 is thin only in the connecting sections, while being thick inside and outside the connecting sections (i.e., in outer and inner portions with respect to the connecting sections in the mounting region). Further, in the present embodiment, the thickness of the wiring pattern 57 is the same between the outer portions of the connecting sections and the inner portions of the connecting sections.

Note that, the connecting sections refer to portions where the protruding electrodes 5 disposed on the semiconductor element 2 are bonded to the wiring pattern 57 within the mounting region. That is, the connecting sections are part of the mounting region in which the protruding electrodes 5 disposed on the semiconductor elements 2 are bonded to the wiring pattern 57.

Further, each of the connecting sections is formed so that a length of the connecting section is greater than a length of the protruding electrode (connecting member) 5 by approximately 40 μm. The "length of the connecting section" refers to a length of a portion where the thickness of the wiring pattern 57 is made thinner in the connecting section. Further, the "length of the protruding electrode 5" refers to a design length of the protruding electrode 5. That is, when the protruding electrodes 5 are placed at the center positions of the respective connecting sections, a distance between an outer edge of the protruding electrodes 5 and an edge of the connecting sections will be approximately 20 μm at both sides. With the above structure, for example, even when an accuracy of bonding between the semiconductor element 2 and the tape carrier 53 is ±15 μm and a tolerance of a fabrication size of the protruding electrodes 5 is ±10 μm, it is possible to prevent the semiconductor element 2 from being bonded to the tape carrier 53 while being mispositioned off from the connecting sections. It should be noted, however, that the difference in length between the semiconductor element 2 and the protruding electrode 5 is not limited to 40 μm. Further, it is preferable that the thickness of the wiring pattern 57 in the connecting sections be in a range from 3 μm to 6 μm, for example. However, the thickness of the wiring pattern 57 is not limited to the above thickness. The thickness of the wiring pattern 57 may allow the wiring pattern 57 to be designed with a fine pitch, while preventing the protruding electrodes 5 from contacting the insulation tape 6.

Further, the wiring pattern 57 is more effective when a wiring pitch, i.e., an interval of the wires, is below 35 μm. When the wiring pitch is below 35 μm, the tape carrier 35 is regarded as a fine-pitch carrier.

Note that, the wiring pattern 57 has an external connection terminal (not shown) for connecting the semiconductor device 51 to another electronic component. Further, tin-based plating or Au-based plating (not shown) is applied to a surface of the wiring pattern 57.

The insulation tape 6 has no opening section for mounting the semiconductor element 2. Therefore, the semiconductor element 2 is connected to and mounted on the insulation tape 6 by performing bonding between the protruding electrodes 5 disposed on the semiconductor element 2 and the wiring pattern 57 formed on the surface of the insulation tape 6. That is, the wires of the wiring pattern 7 disposed on the surface of the insulation tape 6 are bonded to the corresponding protruding electrodes 5 disposed on the semiconductor element 2. In this way, the wiring pattern 57 and the semiconductor element 2 are electrically connected.

Figure 17:
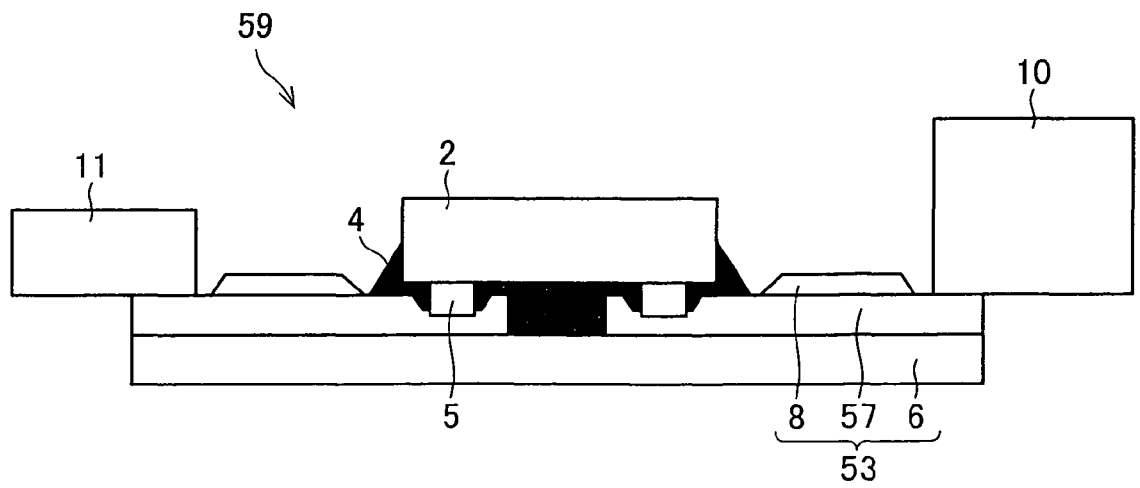
FIG. 17 is a cross-sectional view schematically illustrating a structure of a semiconductor module according to still another embodiment of the present invention.
Figure 18:
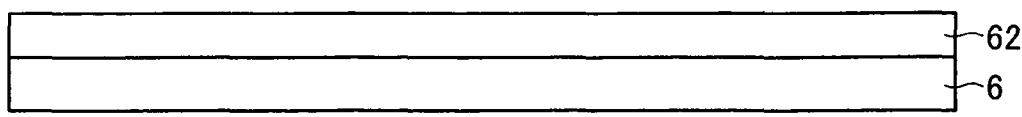
FIGS. 18(a) through 18(d) are cross-sectional views schematically illustrating arrangements of a fabricating method of the semiconductor device according to still another embodiment of the present invention.
Figure 18:
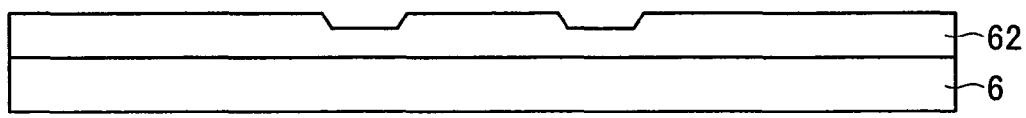
Figure 18:
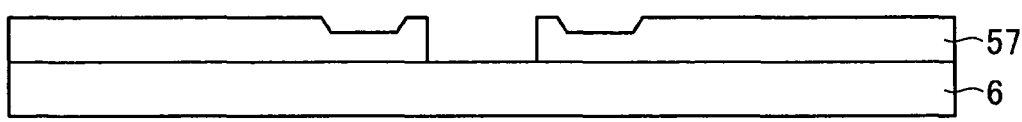
Figure 18:
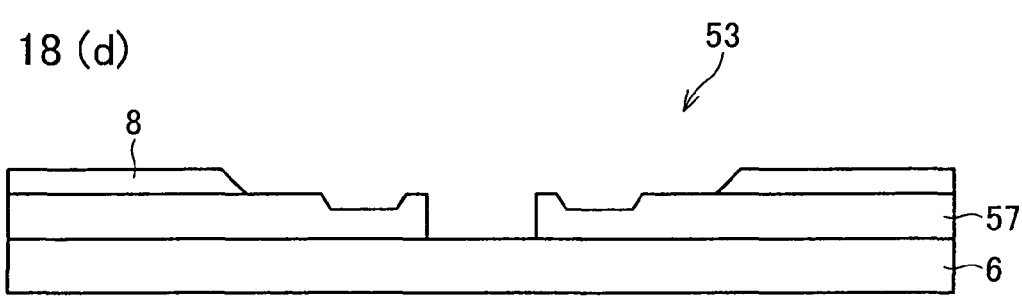

The semiconductor device 51 may serve as a semiconductor module (electronic device) by being connected to another electronic component. In the semiconductor module, for example, the semiconductor device 51 can drive and control another electronic component. FIG. 17 is a cross-sectional view schematically illustrating a structure of a semiconductor module 59 of the present embodiment. In FIG. 3, the semiconductor device 51 is used in a liquid crystal display. In this structure, another electronic component is a liquid crystal panel 10 and a printed board 11. In the semiconductor module 59, the external connection terminal of the wiring pattern 57 in the semiconductor device 51 is connected to the liquid crystal panel 10, the printed board 11, or the like.

With reference to FIGS. 18(a) through 18(d), described next is a fabricating method of the semiconductor device 51 having the above structure. FIGS. 18(a) through 18(d) are cross-sectional views schematically illustrating arrangements of the fabricating method of the semiconductor device 21. The fabricating method of the semiconductor device 21 of the present embodiment includes causing, by applying half etching, a thickness of the copper foil disposed on the insulation tape 6 in the non-connecting sections to be thinner than that in the connecting sections, before etching the copper foil so as to form the wiring pattern 57.

First, as illustrated in FIG. 18(a), a copper foil 62 is formed on the surface of the insulation tape 6 by the casting method, the spattering method (metallizing method), or the like so as to have a thickness of 8 μm to 18 μm.

Next, as illustrated in FIG. 18(b), etching is applied to portions (lines), i.e., connecting sections, on a surface of the copper foil 62 so that a thickness of the copper foil 62 is less in the connecting sections than in the non-connecting sections. It should be noted that the etching is applied so that the length of the connecting section is greater than the length of the protruding electrode 5 by approximately 40 μm. The protruding electrodes 5 are disposed on the semiconductor element 2, which will be connected in a subsequent step.

Further, as illustrated in FIG. 18(c), the wiring pattern 57 is formed in a desirable pattern by etching the copper foil 62 so that the copper foil 62 has a predetermined pattern. In this way, the wiring pattern 57 is formed in all regions where the wiring pattern 57 should be formed (the connecting sections and the non-connecting sections). Then, as illustrated in FIG. 18(d), the solder resist 8 is applied to portions of the wiring pattern 57, which will not be covered when the semiconductor element 2 is mounted in a subsequent step. In this manner, the tape carrier 53 is fabricated.

Next, as in the case of the first embodiment, the semiconductor element 2 is connected to and mounted on the tape carrier 53. After the semiconductor element 2 is connected to and mounted on the tape carrier 53, the insulation resin 4 is injected in a gap between the semiconductor element 2 and the tape carrier 53, so as to seal the gap. In this way, the semiconductor device 51 of the present embodiment is fabricated.

Note that, when the semiconductor device 51 is connected to another electronic component and serves as a semiconductor module 59, as illustrated in FIG. 17, a liquid crystal panel 10, a printed board 11, or the like for example may be connected to the external connection terminal of the wiring pattern 57.

As described above, in the tape carrier 53 used in a COF-type semiconductor device according to the present embodiment, the thickness of the wiring pattern 57 is less in the connecting sections than in the non-connecting sections. Specifically, the thickness of the wiring pattern 57 in the non-connecting sections is in a range from 8 μm to 18 μm, while the thickness of the wiring pattern 57 in the mounting region is in a range from 3 μm to 6 μm.

With the foregoing structure, compared to the conventional tape carrier used in a COF-type semiconductor device, the wiring pattern 57 can be formed in a good pattern by etching. In addition, excellent bonding is attained between the semiconductor element 2 and the wiring pattern 57. Further, mechanical strength of the wiring pattern 57 in the non-connecting sections is improved, so that failures due to breaks or exfoliation of the wiring pattern 57 can be reduced to 50% or less compared to a conventional wiring pattern.

Further, mechanical strength of the wiring pattern 57 in the non-connecting sections can be improved compared to that of the conventional tape carrier, because the thickness of the wiring pattern 57 is made thinner only in the connecting sections while being maintained in the non-connecting sections with the same thickness of the conventional tape carrier used in a COF-type semiconductor device. Thus, failures due to breaks or exfoliation of the wiring pattern 57 is reduced. Further, misposition of the semiconductor element 2 is also reduced at the time of its bonding.

Sixth Embodiment

Figure 19:
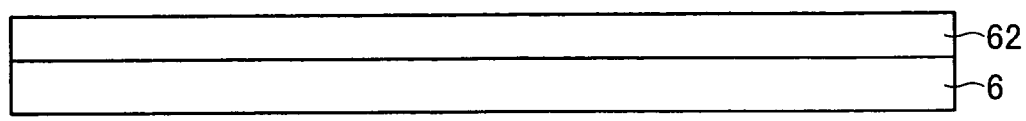
FIGS. 19(a) through 19(d) are cross-sectional views schematically illustrating arrangements of a fabricating method of the semiconductor device according to still another embodiment of the present invention.
Figure 19:
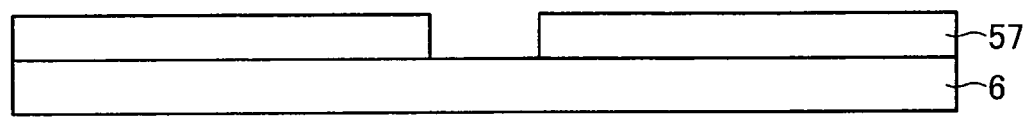
Figure 19:
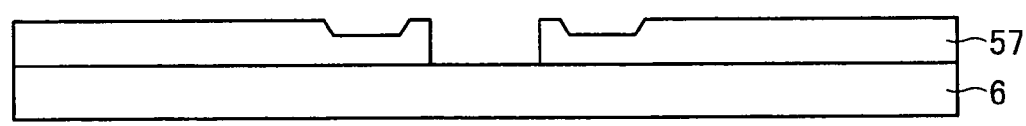
Figure 19:
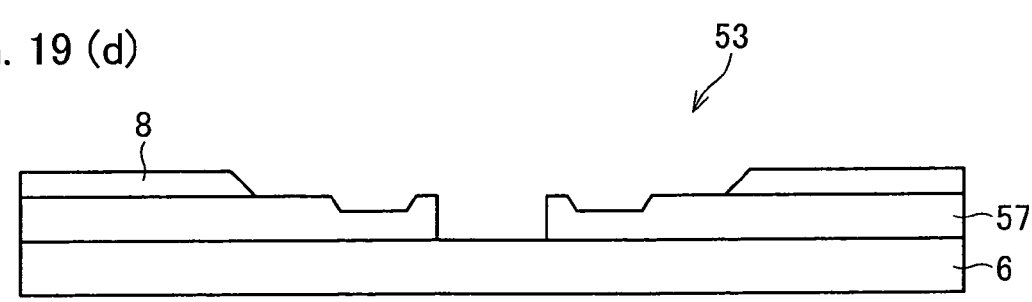

With reference to FIGS. 16, 17, and 19(d), a sixth embodiment of the present invention is described below.

FIG. 16 is a cross-sectional view schematically illustrating a structure of a semiconductor device 51 of the present embodiment. Compared to the fifth embodiment, the present embodiment describes a different fabricating method of the semiconductor device 51, though the structure of the semiconductor device 51 is the same. Thus, constituting elements having the same functions as those described in the fifth embodiment are indicated by the same reference numerals, and their explanations are omitted. In the present embodiment, the fabricating method of the semiconductor device 51 is mainly described. Further, the terms used in the fifth embodiment mean the same also in the present embodiment, unless otherwise specified.

With reference to FIGS. 19(a) through 19(d), the fabricating method of the semiconductor device 51 of the present embodiment is described in more detail. FIGS. 19(a) through 19(d) are cross-sectional views schematically illustrating arrangements of the semiconductor device 51 of the present embodiment. The fabricating method of the semiconductor device 51 of the present embodiment includes causing, by applying half etching, a thickness of copper foil disposed on a surface of an insulation tape 6 in connecting sections to be less than that in non-connecting sections, after etching the copper foil so as to form a wiring pattern 57.

First, as illustrated in FIG. 19(a), a copper foil 62 is formed on the surface of the insulation tape 6 by the casting method, the spattering method (metallizing method), or the like so as to have a thickness of 8 μm to 18 μm.

Then, as illustrated in FIG. 19(b), the wiring pattern 57 is formed in a desirable pattern by etching the copper foil 12 so that the copper foil 12 has a predetermined pattern. In this way, the wiring pattern 57 is formed in all regions where the wiring pattern 57 should be formed (the mounting region and the non-mounting region).

Further, as illustrated in FIG. 19(c), etching, i.e., half etching, is applied to a portion on a surface of the wiring pattern 57. These portions correspond to the connecting sections. That is, the etching is applied so that a thickness of the wiring pattern 57 is less in the connecting sections than in the non-connecting sections. It should be noted that the etching is applied so that a length of the connecting section is greater than a length of the protruding electrode 5 by approximately 40 μm.

Then, as illustrated in FIG. 19(d), a solder resist 8 is applied to portions of the wiring pattern 57, which will not be covered when the semiconductor element 2 is mounted in a subsequent step. In this manner, the tape carrier 53 is fabricated.

Next, as in the case of the fifth embodiment, the semiconductor element 2 is connected to and mounted on the tape carrier 53. After the semiconductor element 2 is connected to and mounted on the tape carrier 53, an insulation resin 4 is injected in a gap between the semiconductor element 2 and the tape carrier 53, so as to seal the gap. In this manner, the semiconductor device 51 of the present embodiment is fabricated.

Note that, when the semiconductor device 51 is connected to another electronic component and serves as a semiconductor module 59, as illustrated in FIG. 17, a liquid crystal panel 10, a printed board 11, or the like for example may be connected to an external connection terminal of the wiring pattern 57.

As described above, in the tape carrier 53 used in a COF-type, semiconductor device according to the present embodiment, the thickness of the wiring pattern 57 is less in the connecting sections than in the non-connecting sections. Specifically, the thickness of the wiring pattern 57 in the non-connecting sections is in a range from 8 μm to 18 μm, while the thickness of the wiring pattern 57 in the mounting region is in a range from 3 µm to 6 µm.

With the foregoing structure, compared to the conventional tape carrier used in a COF-type semiconductor device, the wiring pattern 57 can be formed in a good pattern by etching. In addition, excellent bonding is attained between the semiconductor element 2 and the wiring pattern 57. Further, mechanical strength of the wiring pattern 57 in the non-connecting sections is improved, so that failures due to breaks or exfoliation of the wiring pattern 57 can be reduced to 50% or less compared to a conventional wiring pattern. Further, misposition of the semiconductor element 2 is also reduced at the time of its bonding.

Seventh Embodiment

Figure 20:
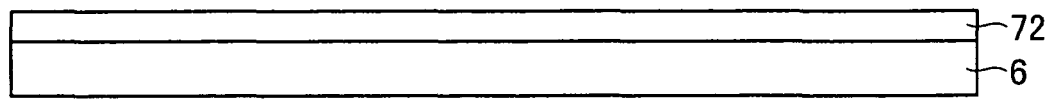
FIGS. 20(a) through 20(d) are cross-sectional views schematically illustrating arrangements of a fabricating method of the semiconductor device according to still another embodiment of the present invention.
Figure 20:
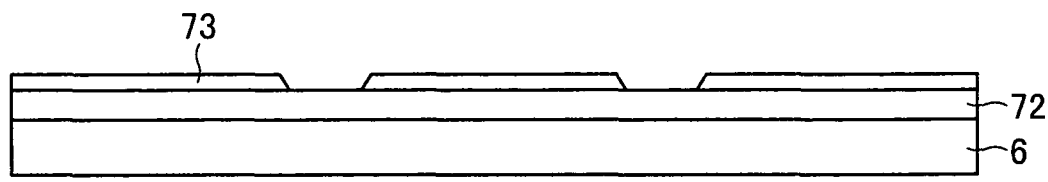
Figure 20:
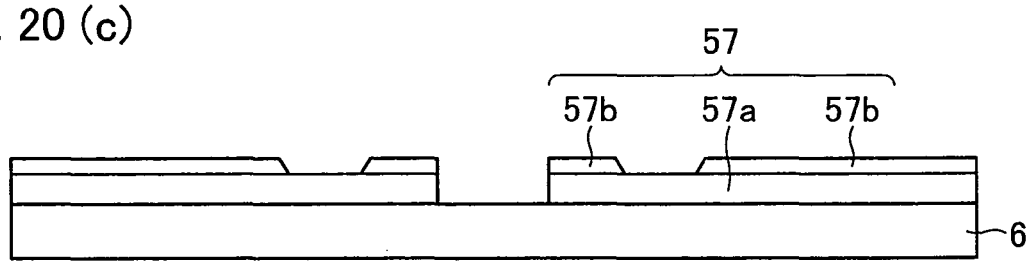
Figure 20:
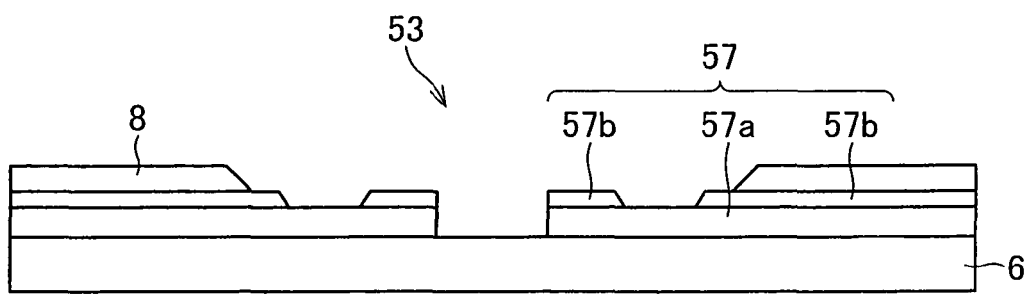

With reference to FIGS. 16, 17, and 20(*d*), a seventh embodiment of the present invention is described below.

FIG. 16 is a cross-sectional view schematically illustrating a structure of a semiconductor device 51 of the present embodiment. The semiconductor device 51 of the present embodiment includes a wiring pattern 57 having two layers (a first wiring layer and a second wiring layer). Further, compared to the fifth embodiment, the structure of the semiconductor device 51 is basically the same. Thus, constituting elements having the same functions as those described in the fifth embodiment are indicated by the same reference numerals, and their explanations are omitted. In the present embodiment, the fabricating method of the semiconductor device 51 is mainly described. Further, the terms used in the fifth embodiment mean the same also in the present embodiment, unless otherwise specified.

With reference to FIGS. 20(*a*) through 20(*d*), the fabricating method of the semiconductor device 51 of the present embodiment is described in more detail. FIGS. 20(*a*) through 20(*d*) are cross-sectional view schematically illustrating arrangements of the semiconductor device 51 of the present embodiment. The fabricating method of the semiconductor device 51 of the present embodiment includes increasing, by applying electroplating or the like, a thickness of copper foil disposed on a surface of an insulation tape 6 in non-connecting sections to be greater than that in connecting sections, before etching the copper foil so as to form the wiring pattern 57.

First, as illustrated in FIG. 20(*a*), a first copper foil layer 72 is formed on the surface of the insulation tape 6 by the casting method, the spattering method (metallizing method), or the like so as to have a thickness of 3 µm to 6 µm. Further, as illustrated in FIG. 20(*b*), a second copper foil layer 73 is formed in portions on the first copper foil layer 72. These portions correspond to the non-connecting sections. The second copper foil layer 73 is formed so that a total thickness of the first copper foil layer 72 and the second copper foil layer 73 is in a range from 8 µm to 18 µm. It should be noted that the second copper foil layer 73 is formed so that a length of the connecting section is greater than a length of the protruding electrode 5 disposed on the semiconductor element 2 by approximately 40 µm.

Then, as illustrated in FIG. 20(*c*), the wiring pattern 57 is formed in a desirable pattern by etching the first copper foil layer 72 and the second copper foil layer 73 so that the first copper foil layer 72 and the second copper foil layer 73 have a predetermined pattern. In this way, the wiring pattern 57 is formed, which includes the first copper foil layer 72 and the second copper foil layer 73. The wiring pattern 57 is formed in all regions where the wiring pattern 57 should be formed (the connecting sections and the non-connecting sections).

Then, as illustrated in FIG. 20(*d*), a solder resist 8 is applied to portions of the wiring pattern 57, which will not be covered when the semiconductor element 2 is mounted in a subsequent step. In this manner, the tape carrier 53 is fabricated.

Next, as in the case of the fifth embodiment, the semiconductor element 2 is connected to and mounted on the tape carrier 53. After the semiconductor element 2 is connected to and mounted on the tape carrier 53, an insulation resin 4 is injected in a gap between the semiconductor element 2 and the tape carrier 53, so as to seal the gap. In this way, the semiconductor device 51 of the present embodiment is fabricated.

Note that, when the semiconductor device 51 is connected to another electronic component and serves as a semiconductor module 59, as illustrated in FIG. 17, a liquid crystal panel 10, a printed board 11, or the like for example may be connected to an external connection terminal of the wiring pattern 57.

As described above, in the tape carrier 53 used in a COF-type semiconductor device according to the present embodiment, the thickness of the wiring pattern 57 is less in the connecting sections than in the non-connecting sections. Specifically, the thickness of the wiring pattern 57 in the non-connecting sections is in a range from 8 µm to 18 µm, while the thickness of the wiring pattern 57 in the mounting region is in a range from 3 µm to 6 µm.

With the foregoing structure, compared to the conventional tape carrier used in a COF-type semiconductor device, the wiring pattern 57 can be formed in a good pattern by etching. In addition, excellent bonding is attained between the semiconductor element 2 and the wiring pattern 57. Further, mechanical strength of the wiring pattern 57 in the non-connecting sections is improved, so that failures due to breaks or exfoliation of the wiring pattern 57 can be reduced to 50% or less compared to a conventional wiring pattern. Further, misposition of the semiconductor element 2 is also reduced at the time of its bonding.

Eighth Embodiment

Figure 21:
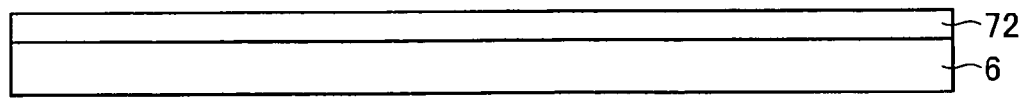
Figure 21:
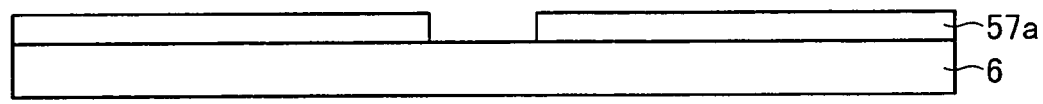
Figure 21:
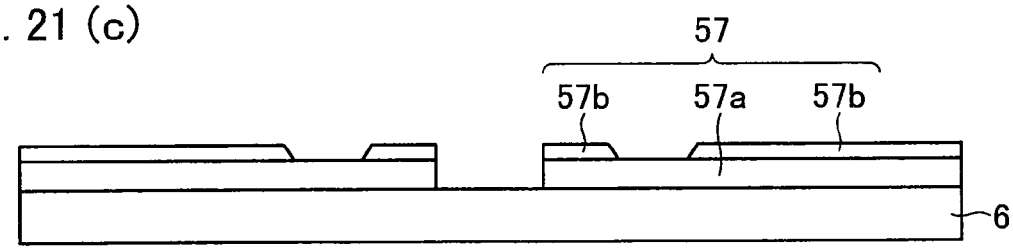
Figure 21:
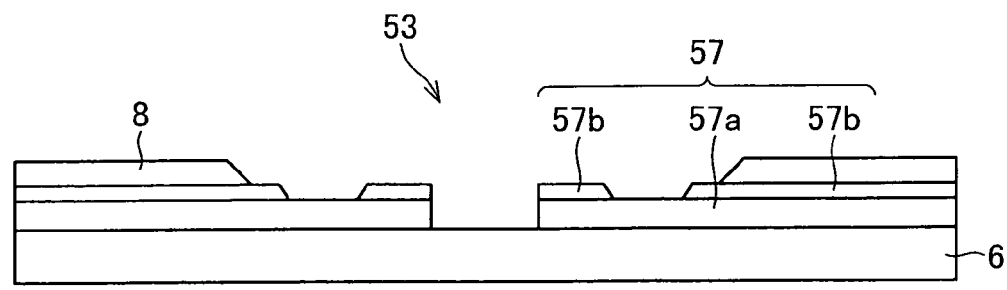

With reference to FIGS. 16, 17, and 21(*d*), an eighth embodiment of the present invention is described below.

FIG. 16 is a cross-sectional view schematically illustrating a structure of a semiconductor device 51 of the present embodiment. The semiconductor device 51 of the present embodiment includes a wiring pattern 57 having two layers (a first wiring layer and a second wiring layer). Further, compared to the fifth embodiment, the structure of the semiconductor device 51 is basically the same. Thus, constituting elements having the same functions as those described in the fifth embodiment are indicated by the same reference numerals, and their explanations are omitted. In the present embodiment, the fabricating method of the semiconductor device 51 is mainly described. Further, the terms used in the fifth embodiment mean the same also in the present embodiment, unless otherwise specified.

With reference to FIGS. 21(*a*) through 21(*d*), the fabricating method of the semiconductor device 51 of the present embodiment is described in more detail. FIGS. 21(*a*) through 21(*d*) are cross-sectional views schematically illustrating arrangements of the semiconductor device 51 of the present embodiment. The fabricating method of the semiconductor device 51 of the present embodiment includes increasing, by applying electroplating or the like, a thickness of copper foil disposed on a surface of an insulation tape 6 in non-connecting sections to be greater than that in connecting sections, after etching the copper foil so as to form the wiring pattern 57.

First, as illustrated in FIG. 21(a), a first copper foil layer 72 is formed on the surface of the insulation tape 6 by the casting method, the spattering method (metallizing method), or the like so as to have a thickness of 3 μm to 6 μm.

Next, as illustrated in FIG. 21(b), a wiring layer 57a is formed in a desirable pattern by etching the first copper foil layer 72 so that the first copper foil layer 72 has a predetermined pattern. In this way, the first wiring layer 57a is formed in all regions where the wiring layer 57a should be formed (the connecting sections and the non-connecting sections).

Further, as illustrated in FIG. 21(c), a second wiring layer 57b is formed in portions on the first wiring layer 57a. These portions correspond to the non-connecting sections. In this way, the first wiring layer 57a and the second wiring layer 57b are etched so as to have a predetermined pattern, and thereby the wiring pattern 57 is formed. The second wiring layer 57b is formed by depositing copper plating on the first wiring layer 57a by applying electroplating for example. Further, the second wiring layer 57b is formed so that a total thickness of the first wiring layer 57a and the second wiring layer 57b is in a range from 8 μm to 18 μm. The second wiring layer 57b is formed so that a length of the connecting section is greater than a length of the protruding electrode 5 disposed on the semiconductor element 2 by approximately 40 μm.

Then, as illustrated in FIG. 21(d), a solder resist 8 is applied to portions of the wiring pattern 57, which will not be covered with the semiconductor element 2 when the semiconductor element 2 is mounted in a subsequent step. In this manner, the tape carrier 53 is fabricated.

Next, as in the case of the fifth embodiment, the semiconductor element 2 is connected to and mounted on the tape carrier 53. After the semiconductor element 2 is connected to and mounted on the tape carrier 53, an insulation resin 4 is injected in a gap between the semiconductor element 2 and the tape carrier 53, so as to seal the gap. In this way, the semiconductor device 51 of the present embodiment is fabricated.

Note that, when the semiconductor device 51 is connected to another electronic component and serves as a semiconductor module 59, as illustrated in FIG. 17, a liquid crystal panel 10, a printed board 11, or the like for example may be connected to an external connection terminal of the wiring pattern 57.

As described above, in the tape carrier 53 used in a COF-type semiconductor device according to the present embodiment, the thickness of the wiring pattern 57 is less in the connecting sections than in the non-connecting sections. Specifically, the thickness of the wiring pattern 57 in the non-connecting sections is in a range from 8 μm to 18 μm, while the thickness of the wiring pattern 57 in the mounting region is in a range from 3 μm to 6 μm.

With the foregoing structure, compared to the conventional tape carrier used in a COF-type semiconductor device, the wiring pattern 57 can be formed in a good pattern by etching. In addition, excellent bonding is attained between the semiconductor element 2 and the wiring pattern 57. Further, mechanical strength of the wiring pattern 57 is improved in the non-connecting sections, so that failures due to breaks or exfoliation of the wiring pattern 57 can be reduced to 50% or less compared to a conventional wiring pattern.

In the flexible wiring substrate of the present invention, it is preferable that the thickness of the wiring layer in the non-connecting sections in the mounting region be equal to the thickness of the wiring layer in the non-connecting sections in the non-mounting region. According to the above arrangement, mechanical strength of the wiring layer can be improved due to the same thickness of the wiring layer in the non-connecting sections in all regions. Thus, even when the flexible wiring substrate is folded, the wiring pattern can be prevented from being broken or exfoliated.

The flexible wiring substrate of the present invention is more effective when an interval of at least one pair of adjacent wires of the pattern is below 35 μm. According to the above arrangement, the wiring layer can be designed with a fine pitch.

In the flexible wiring substrate of the present invention, it is preferable that the thickness of the wiring layer in the mounting region or the connecting sections be in a range from 3 μm to 6 μm. According to the above arrangement, even when the wires are etched in the mounting region or the connecting sections, the wires can be etched so as to have a good cross section. Further, a variation in thickness of the wires of the pattern can be reduced, so that excellent bonding with the electronic component is realized.

In the flexible wiring substrate of the present invention, it is preferable that the thickness of the wiring layer in the non-mounting region or the non-connecting sections be 8 μm or greater. According to the above arrangement, mechanical strength of the wiring layer can be improved. Thus, even when the flexible wiring substrate is folded, the wiring pattern can be prevented from being broken or exfoliated.

In the flexible wiring substrate of the present invention, the connecting sections are inner lead sections. According to the above arrangement, the connecting sections are provided within the mounting region. This structure realizes excellent bonding with the electronic component, while improving mechanical strength of the wiring layer.

In the flexible wiring substrate of the present invention, it is preferable that the electronic component have connecting members for performing the connections with the connecting sections, and a thickness of the wiring layer in the connecting sections be thinner than that of the rest of the wiring layer considering an accuracy of bonding between the connecting sections and the connecting members and a tolerance of a fabrication size of the connecting sections. It is further preferable that, when the accuracy of the bonding is ±15 μm and the tolerance of the fabrication size of the connecting members is ±10 μm, the thickness of the wiring layer in the connecting section is thinner than that of the rest of the wiring layer by at least a sum of a design length of the connecting members and 40 μm.

According to the above arrangement, the thickness of the wiring layer in the connecting sections is made thinner than that of the rest of the wiring layer considering the accuracy of the bonding and the tolerance of the connecting members. For example, when the accuracy of the bonding to the electronic component is approximately 15 μm and the tolerance of the fabrication size of the connecting members is approximately ±10 μm, the thickness of the wiring layer in the connecting sections is thinner by at least a sum of a design length of the connecting members and 40 μm. This enables the connecting members of the electronic component to be connected so that the connecting members will not be mispositioned off from the connecting sections, whereby failure bonding is prevented. Note that, the accuracy of the bonding refers to an accuracy of positional deviation occurred when the connecting members are connected to the connecting sections. Further, the tolerance of the connecting members of the connecting sections refers to a margin of error with respect to a size of the connecting members, which occurs during the fabrication. The design length of the connecting members refers to a targeted length (designed length) of the connecting members in which the tolerance of the fabrication size is not considered. The actual size of the finished product is a total length of the design length and the tolerance of the fabrication size.

In the fabricating method of the flexible wiring substrate of the present invention, it is preferable that the step for causing the thickness of the wiring layer to be thinner than that of the rest, of the wiring layer (hereinafter referred to as "thin-thickness realizing step) be carried out between a step for forming the wiring layer (hereinafter referred to as "wiring layer forming step") and a step for patterning the wiring layer (hereinafter referred to as wiring layer patterning step). According to the above arrangement, the wiring layer patterning step is carried out after the thickness of the wiring layer is made thinner in the portions, where the electronic component is connected, on the wiring layer than in the other portions. In this case, the thickness of the wiring pattern is made thinner easily without using a method of a high accuracy, because the thickness of the wiring pattern is made thinner in a relatively large area.

In the fabricating method of the flexible wiring substrate of the present invention, it is preferable that the thin-thickness realizing step be carried out after the pattern forming step. According to the above arrangement, a variation in thickness of the pattern can be reduced because the pattern forming step is carried out after the thickness of the wiring pattern is made thinner in the portion, where the electronic component is connected, on the wiring layer than in the other portions.

In the fabricating method of the flexible wiring substrate of the present invention, it is preferable that the thin-thickness realizing step be carried out by etching. According to the above arrangement, the thickness of the wiring layer can be made thinner easily.

In the fabricating method of the flexible wiring substrate of the present invention, it is preferable that the second wiring layer forming step be carried out between the first wiring layer forming step and the pattern forming step. According to the above arrangement, the pattern is formed after the second wiring layer is formed in the portions, where the electronic component is not connected to the first wiring layer, on the first wiring layer. In this case, the second wiring layer can be stacked easily without using a method of a high accuracy, because the second wiring layer is formed in a relatively large area.

In the fabricating method of the flexible wiring substrate of the present invention, it is preferable that the second wiring layer forming step be carried out after the pattern forming step. According to the above arrangement, a variation in thickness of the pattern can be reduced because the thickness of the wiring layer is increased after the pattern is formed.

In the fabricating method of the flexible wiring substrate of the present invention, it is preferable that the second wiring layer forming step be carried out by spattering method (metallizing method). According to the above arrangement, the thickness of the wiring layer can be increased easily in other portions where the electronic component is not connected than the portions where the electronic component is connected.

Further, with the foregoing structure in which the wiring layer is etched so as to have a good shape and excellent bonding is attained between the wiring layer and the electronic component, the flexible wiring substrate of the present invention realizes a fine pitch of the wiring pattern, while improving mechanical strength of the wiring pattern. Thus, failure bonding is prevented. Further, even when the flexible wiring substrate is folded, the wiring pattern can be prevented from being broken or exfoliated.

The tape carrier of the present invention can be also described as follows. The tape carrier is fabricated by establishing electric connections between wires of a wiring pattern disposed on its surface and protruding electrodes disposed on the semiconductor element, and then electrically insulating the bonded portions with an insulation resin. Further, the wires of the wiring pattern have a wiring pitch of below 35 μm in a region where the semiconductor element is connected and mounted. With the above structure, the tape carrier of the present invention may be a thin film insulation tape, used in a COF semiconductor device, in which a thickness of the wiring pattern is less in the region where the semiconductor element is connected and mounted than in other regions where the semiconductor element is not connected and mounted. In the tape carrier, the wiring pattern may be formed so as to have a thickness of 3 μm to 6 μm in the region where the semiconductor element is connected and mounted.

Further, the fabricating method of the tape carrier of the present invention can be described as follows. The fabricating method may include causing a thickness of the wiring pattern in a region, where the semiconductor element is connected and mounted, to be less than that in other regions by applying half etching, and then forming the wiring pattern by applying pattern etching to the regions including the other regions.

The above fabricating method may be arranged so that, after the wiring pattern is formed by etching, the thickness of the wiring patterns in the region, where the semiconductor element will be connected and mounted in a subsequent step, is reduced by applying half etching so that the thickness is less in the above region than in other regions.

Further, the tape carrier of the present invention can be also described as follows. The tape carrier is fabricated by establishing electric connections between plural wires of a wiring pattern disposed on its surface and protruding electrodes disposed on a semiconductor element, and then electrically insulating the bonded portions with an insulation resin. Further, the wires of the wiring pattern have a wiring pitch of below 35 μm in a region where the semiconductor element is connected and mounted. With the above structure, the tape carrier of the present invention may be a thin film insulation tape, used in a COF semiconductor device, in which the thickness of the wiring pattern is greater in a region where the semiconductor element is not connected and mounted than in the region where the semiconductor element is connected and mounted. In the tape carrier, the wiring pattern may be formed with a thickness of 8 μm or greater in the region where the semiconductor element is not connected and mounted.

Further, the fabricating method of the tape carrier of the present invention can be also described as follows. Before a wiring pattern is formed by etching, a thickness of the wiring pattern in a region, where the semiconductor element will not be connected and mounted, is increased by deposition using the spattering method (metallizing method) so that the thickness is greater in the above region than in a region where the semiconductor element will be connected and mounted in a subsequent step.

The above method may be arranged so that, after the wiring pattern is formed by etching, the thickness of the wiring pattern in the region, where the semiconductor element will not be connected and mounted, is increased by deposition using the spattering method (metallizing method) so that the thickness is greater in the above region than in the region where the semiconductor element will be connected and mounted in a subsequent step.

The present invention is not limited to the description of the embodiments above, and may be altered by a skilled person within the scope of the claims. An embodiment based on a proper combination of technical means disclosed in different embodiments is encompassed in the technical scope of the present invention.

As described above, according to the present invention, a flexible wiring substrate, obtained with the fabricating method of a flexible wiring substrate, enables wiring patterns to be designed with a fine pitch, while improving its mechanical strength and electric connection with a semiconductor element. Thus, the flexible wiring substrate of the present invention can be favorably used, especially as a wiring board or the like used in a small-sized and thin electric device.

Thus, the present invention can be favorably applied not only in the industrial field where flexible wiring substrates are manufactured, but also in industrial fields where various electronic and electric devices or their components are manufactured.

The embodiments and concrete examples of implementation discussed in the foregoing detailed explanation serve solely to illustrate the technical details of the present invention, which should not be narrowly interpreted within the limits of such embodiments and concrete examples, but rather may be applied in many variations within the spirit of the present invention, provided such variations do not exceed the scope of the patent claims set forth below.

What is claimed is:

1. A flexible wiring substrate comprising:
    an insulating layer; and
    a wiring layer formed on the insulating layer,
        the wiring layer being formed so as to have a predetermined pattern and having a mounting region for connecting and mounting an electronic component, and
        a thickness of the wiring layer being less in the mounting region than in a non-mounting region, wherein
    an interval of at least one pair of adjacent wires of the wiring pattern is below 35 μm, and
    wires of the wiring layer have a trapezoidal cross section in the mounting region.

2. The flexible wiring substrate according to claim 1, wherein the thickness of the wiring layer in the mounting region is in a range from 3 μm to 6 μm.

3. The flexible wiring substrate according to claim 1, wherein the thickness of the wiring layer in the non-mounting region is 8 μm or greater.

4. The flexible wiring substrate according to claim 1, wherein the wiring layer has, within the mounting region, a connection section for connecting the electronic component, and the connecting section is an inner lead section.

5. A semiconductor device comprising:
    the flexible wiring substrate according to claim 1; and
    a semiconductor element connected to a connecting section of the flexible wiring substrate.

6. An electronic device comprising the semiconductor device according to claim 5.

* * * * *